United States Patent
Eguchi et al.

(10) Patent No.: US 9,587,102 B2
(45) Date of Patent: Mar. 7, 2017

(54) FLAME-RETARDANT RESIN FILM AND SOLAR BATTERY BACK SHEET USING THE SAME

(75) Inventors: Yutaka Eguchi, Tokyo (JP); Minoru Sakata, Tokyo (JP); Hiroaki Furukawa, Tokyo (JP)

(73) Assignee: ASAHI KASEI CHEMICALS CORPORATION, Tokyo (JP)

( * ) Notice: Subject to any disclaimer, the term of this patent is extended or adjusted under 35 U.S.C. 154(b) by 289 days.

(21) Appl. No.: 14/118,577

(22) PCT Filed: May 18, 2012

(86) PCT No.: PCT/JP2012/062852
§ 371 (c)(1),
(2), (4) Date: Nov. 19, 2013

(87) PCT Pub. No.: WO2012/161134
PCT Pub. Date: Nov. 29, 2012

(65) Prior Publication Data
US 2014/0230887 A1 Aug. 21, 2014

(30) Foreign Application Priority Data

May 20, 2011 (JP) ................................ 2011-113501
May 20, 2011 (JP) ................................ 2011-113503
Feb. 22, 2012 (JP) ................................ 2012-036569

(51) Int. Cl.
| | | |
|---|---|---|
| C08L 27/18 | (2006.01) | |
| H01L 31/048 | (2014.01) | |
| C08L 71/12 | (2006.01) | |
| H01L 31/049 | (2014.01) | |
| B32B 27/28 | (2006.01) | |
| C08J 5/18 | (2006.01) | |

(52) U.S. Cl.
CPC ............ *C08L 27/18* (2013.01); *B32B 27/285* (2013.01); *C08J 5/18* (2013.01); *C08L 71/12* (2013.01); *H01L 31/049* (2014.12); *B32B 2307/3065* (2013.01); *B32B 2457/10* (2013.01); *C08J 2371/12* (2013.01); *C08J 2427/18* (2013.01); *Y02E 10/50* (2013.01)

(58) Field of Classification Search
CPC ............................ C08L 27/18; H01L 31/0487
USPC ....................................................... 136/252
See application file for complete search history.

(56) References Cited

U.S. PATENT DOCUMENTS

| | | | |
|---|---|---|---|
| 4,355,126 A | 10/1982 | Haaf et al. | |
| 4,532,281 A | 7/1985 | Lee, Jr. et al. | |
| 5,449,721 A | 9/1995 | Suzuki et al. | |
| 2012/0097220 A1* | 4/2012 | Miyashita | ............... B32B 27/08 136/251 |

FOREIGN PATENT DOCUMENTS

| | | |
|---|---|---|
| CN | 101218305 A | 7/2008 |
| EP | 1452567 A1 | 9/2004 |
| JP | 58-164634 A | 9/1983 |
| JP | 11-5879 A | 1/1999 |
| JP | 11-209601 A | 8/1999 |
| JP | 2000-309700 A | 11/2000 |
| JP | 2001-207072 A | 7/2001 |
| JP | 2004-292660 A | 10/2004 |
| JP | 2006-324556 A | 11/2006 |
| JP | 2007-70430 A | 3/2007 |
| JP | 2010-519389 A | 6/2010 |
| JP | 2010-195935 A | 9/2010 |
| JP | 2010-278428 A | 9/2010 |
| JP | 2010-245380 A | 10/2010 |
| JP | WO 2010126088 A1 * 11/2010 ............. B32B 27/08 |
| TW | 201043460 A1 | 12/2010 |
| WO | 2006/126670 A1 | 11/2006 |
| WO | 2008/103556 A2 | 8/2008 |

OTHER PUBLICATIONS

International preliminary report on patentability issued with respect to application No. PCT/JP2012/062852, mail date is Nov. 20, 2013.
European search report issued with respect to application No. 12788767.7, mail date is Jun. 3, 2015.
Office Action issued on Feb. 18, 2014 for Taiwanese application No. 101118059.
Search Report issued with respect to International Application No. PCT/JP2012/062852, mail date Aug. 7, 2012.

* cited by examiner

*Primary Examiner* — Catherine S Branch
(74) *Attorney, Agent, or Firm* — Greenblum & Bernstein, P.L.C.

(57) ABSTRACT

An object of the present invention is to provide a flame-retardant resin composition having high flame retardancy, and a flame-retardant resin film having high thickness precision and excellent flame retardancy and a solar battery back sheet. The flame-retardant resin film according to the present invention is a flame-retardant resin film obtained from a resin composition, wherein the resin composition comprises a polyphenylene ether resin (a), a phosphorus flame retardant (b), and a fluorine-containing resin (c); in the resin composition, the content of the component (a) is 75 to 98 parts by mass and the content of the component (b) is 25 to 2 parts by mass, based on 100 parts by mass of the components (a) and (b) in total; the content of a fluorine element in the resin composition is 100 to 1000 mass ppm; and the flame-retardant resin film has a thickness of 20 to 500 μm.

10 Claims, No Drawings

FLAME-RETARDANT RESIN FILM AND SOLAR BATTERY BACK SHEET USING THE SAME

TECHNICAL FIELD

The present invention relates to a flame-retardant resin film and a solar battery back sheet using the resin film.

BACKGROUND ART

In the past, the polyphenylene ether resins have used for home appliances, OA apparatuses, and automobile parts because these resins have high electrical insulation properties, and have heat resistance, hydrolysis resistance, and flame retardancy.

In such circumstances, to improve the flame retardancy (particularly dropping prevention properties during burning) of the polyphenylene ether resin composition, methods of adding a fluorine resin (such as polytetrafluoroethylene) to the resin composition are proposed (see Patent Documents 1 and 2, for example).

Moreover, the recent resin films need to have performances according to various applications such as electrical insulation properties, heat resistance, hydrolysis resistance, and flame retardancy. Utilizing excellent properties such as electrical insulation properties, heat resistance, hydrolysis resistance, and flame retardancy, the films obtained by forming the polyphenylene ether resin into a sheet have been increasingly used in wider applications (see Patent Document 3, for example).

In the recent proposals, utilizing properties such as durability (hydrolysis resistance), low-temperature shrink properties, and electrical insulation properties, the polyphenylene ether resin film is applied to the back sheet used in photovoltaics (see Patent Documents 4 and 5, for example).

Solar batteries receive attention as an alternative energy source to fossil fuels these days. The solar batteries typically have a layer structure in which a solar battery element that performs photovoltaics is interposed between a transparent glass plate and a back sheet. A sealing material is used to embed the gaps between the solar battery elements. The package of the solar battery elements into a module is called a "solar battery module." The solar battery element has a sunlight receiving surface (front surface) covered with a transparent reinforced glass or the like, and the other surface receiving no sunlight (rear surface) covered with a back sheet.

The sealing material needs to exhibit high adhesiveness to seal the solar battery elements. For such a sealing material, ethylene vinyl acetate (hereinafter, also referred to as an "EVA") and the like are used. The solar battery elements are sealed by filling the sealing material into the gaps between the solar battery elements and performing heat press when glass, the solar battery elements, and the back sheet are integrated by lamination. The sealing can prevent the solar battery elements from moving when the solar battery module is produced. Typically, heat at approximately 150° C. is applied in this heat press step. Accordingly, the back sheet needs to have heat resistance at a certain extent.

Further, because the solar battery module is used outdoors, the members that form the solar battery module need to have sufficient weatherability and durability. From such viewpoints, plastic materials and the like having high heat resistance and weatherability are used for the back sheet.

Examples of the conventional plastic materials used for the back sheet include polyester resins. However, it is pointed out that polyester resins have insufficient hydrolysis resistance that gives an influence on weatherability.

To solve this problem, a polyester sheet having a specific intrinsic viscosity (IV) and biaxially stretched to improve hydrolysis resistance is proposed (see Patent Document 6, for example). Further, a sheet formed of layered gas barrier transparent deposition sheets comprising polycarbonate and inorganic oxide is proposed to improve hydrolysis resistance fundamentally (see Patent Document 7, for example).

LIST OF PRIOR ART DOCUMENTS

Patent Document

Patent Document 1: Japanese Patent Application Laid-Open No. 11-005879
Patent Document 2: Japanese Patent Application Laid-Open No. 2010-195935
Patent Document 3: National Publication of International Patent Application No. 2010-519389
Patent Document 4: Japanese Patent Application Laid-Open No. 2010-245380
Patent Document 5: Japanese Patent Application Laid-Open No. 2010-278428
Patent Document 6: Japanese Patent Application Laid-Open No. 2007-70430
Patent Document 7: Japanese Patent Application Laid-Open No. 2006-324556

SUMMARY OF INVENTION

Problems to be Solved by Invention

However, the resin composition having added polytetrafluoroethylene described in Patent Documents 1 and 2 has high flame retardancy (particularly dropping prevention properties during burning), but injection molded articles formed of the resin composition may have a bad surface appearance (particularly seeable weld portions) at the end of flow point, and the improvement is required.

Further, although single polytetrafluoroethylene products have a granular or cotton-like shape, slightly applied pressure may aggregate polytetrafluoroethylene. For this reason, in the method of adding polytetrafluoroethylene to produce a resin composition, polytetrafluoroethylene is difficult to feed to a resin compounding apparatus uniformly with the standard feeder for adding a resin, and difficult to handle. Moreover, examples of the method of adding polytetrafluoroethylene to produce a resin composition include a method of feeding polytetrafluoroethylene together with another raw material resin to a resin compounding apparatus to produce a resin composition. However, the production method has difficulties to disperse polytetrafluoroethylene in a uniform fibrillar state in the resin composition. For this reason, as the method for producing a resin composition, another method for producing a resin composition is proposed in which polytetrafluoroethylene and part of another raw material resin are heated, molten, and mixed in advance with a resin compounding apparatus to produce a resin masterbatch having polytetrafluoroethylene dispersed in a fibrillar state, and the resin masterbatch and the another raw material resin are again heated, molten, and mixed with the resin compounding apparatus.

However, the production method may cause pyrolysis or a crosslinking reaction of the raw material resin used in production of the resin masterbatch because the raw material resin is subjected to the thermal history twice in the resin composition production step. As a result, the resin composition to be finally obtained may have reduced mechanical physical properties. Further, because of cost for producing the masterbatch, the production method is economically inferior to the production method of adding all the raw materials at once. Moreover, the production method may reduce productivity and yield if polytetrafluoroethylene dispersed in a fibrillar state clogs a wire mesh for removing foreign substances in the resin compounding apparatus.

Additionally, Patent Documents 1 and 2 have no description of a specific effect when a fluorine-containing resin other than polytetrafluoroethylene is used, or the like.

As described above, Patent Document 3 discloses a film formed of a polyphenylene ether resin.

However, at present, a film needs to be formed under a high temperature in the method of forming a film from a polyphenylene ether resin. For this reason, silver streaks are caused by gelated products and carbonized substances by a crosslinking reaction, and decomposition. Accordingly, it is difficult to obtain a film having a good appearance. Moreover, the method easily causes surging. For this reason, the film to be obtained has large fluctuation in the thickness. Accordingly, it is difficult to obtain a film having a uniform thickness or a thin film. Additionally, draw-down often occurs, reducing yield. Further, the film to be obtained by the method has a poor appearance because depressions and projections caused by die lines are seen on the surface of the film. Particularly, a thin film to be obtained by the method drops during burning and cannot demonstrate high burning properties intrinsic to the polyphenylene ether resin.

Meanwhile, Patent Documents 1 and 2 do not examine application of the resin composition having an added fluorine resin (such as polytetrafluoroethylene) to a sheet or film at all. Typically, the film formed of the resin composition having an added fluorine-containing resin has large anisotropy because large orientation during formation of the film causes orientation of the fluorine-containing resin dispersed in a fibrillar state in the raw material resin composition. For this reason, persons skilled in the art usually do not apply the resin composition having an added fluorine resin to the film.

Thus, at present, no specific solutions other than the method of adding polytetrafluoroethylene to the resin composition are found as the drop preventing method during burning the polyphenylene ether resin composition. Further, no specific solutions are found as the method for improving the surface appearance, productivity, and yield of the polyphenylene ether resin composition at the same time. Further, in the film using the polyphenylene ether resin composition, no specific solutions including examination of the resin composition as the raw material are found as the methods for improving film forming properties, improving the surface appearance of the film to be obtained, and preventing dropping during burning.

Meanwhile, as described above, the solar battery module constituting members need to have flame retardancy these days. The plastic sheet that forms the back sheet (solar battery back sheet) as a solar battery module constituting member also needs to have the rank VTM-0 that is the highest flame retardancy level in the UL94 VTM test (thin material vertical burning test), for example.

In the back sheet using the polyethylene terephthalate film described in Patent Document 4, no flame retardancy is given to the polyethylene terephthalate film itself. Accordingly, the back sheet may not sufficiently meet the demand for higher flame-retardancy. Similarly, the sheet described in Patent Document 5 contains polycarbonate having poor flame retardancy, and does not meet the demand for higher flame-retardancy above if the sheet is used as it is.

Meanwhile, the back sheet is formed of multi-layered films to meet each of the demanded performances. The thicknesses of the respective films that form the back sheet become thinner and thinner. A recent demand for the film that forms the back sheet is that the range with the film thickness of 20 to 500 μm contains a small amount of foreign substances and the film has high thickness precision.

In the present invention, a film article formed of a single layer having a thickness of 20 to 500 μm is referred to as a "film."

An object of the present invention is to provide a flame-retardant resin composition having an improved surface appearance. Another object of the present invention is to improve productivity and yield of the flame-retardant resin composition at the same time.

Further another object of the present invention is to provide a flame-retardant resin film having high flame retardancy, a good surface appearance, and high thickness precision, and a solar battery back sheet containing the flame-retardant resin film.

Means for Solving Problems

As a result of extensive research to solve the above problems, the present inventors have found out that use of a resin composition containing a specific amount of a polyphenylene ether resin, a specific amount of a phosphorus flame retardant, and a fluorine-containing resin attains a flame-retardant resin composition and flame-retardant resin film in which the above problems are solved, and a solar battery back sheet containing the flame-retardant resin film, and have completed the present invention.

Namely, the present invention is as follows.

[1]

A flame-retardant resin film obtained from a resin composition, wherein the resin composition comprises a polyphenylene ether resin (a), a phosphorus flame retardant (b), and a fluorine-containing resin (c), in the resin composition, a content of the component (a) is 75 to 98 parts by mass and a content of the component (b) is 25 to 2 parts by mass, based on 100 parts by mass of the components (a) and (b) in total, a content of a fluorine element is 100 to 1000 mass ppm in the resin composition, and the flame-retardant resin film has a thickness of 20 to 500 μm.

[2]

The flame-retardant resin film according to [1], wherein the fluorine-containing resin as the component (c) is an olefin-fluoroethylene copolymer.

[3]

The flame-retardant resin film according to [2], wherein the olefin-fluoroethylene copolymer as the component (c) is an ethylene-tetrafluoroethylene copolymer.

[4]

The flame-retardant resin film according to [1], wherein the fluorine-containing resin as the component (c) is polytetrafluoroethylene.

[5]

The flame-retardant resin film according to any one of [1] to [4], wherein the resin composition further comprises an elastomer (d), and in the resin composition, a content of the component (d) is 1 to 25 parts by mass based on 100 parts by mass of the components (a) and (b) in total.

[6]

A solar battery back sheet, comprising the flame-retardant resin film according to any one of [1] to [5].

[7]

A flame-retardant resin composition, comprising a polyphenylene ether resin (a), a phosphate ester flame retardant (b), and an ethylene-tetrafluoroethylene copolymer (c), wherein a content of the component (a) is 75 to 98 parts by mass and a content of the component (b) is 25 to 2 parts by mass, based on 100 parts by mass of the components (a) and (b) in total, and a content of a fluorine element is 100 to 1000 mass ppm.

[8]

The flame-retardant resin composition according to [7], further comprising an elastomer (d), wherein a content of the component (d) is 1 to 25 parts by mass based on 100 parts by mass of the components (a) and (b) in total.

[9]

A resin pellet, comprising the flame-retardant resin composition according to [7] or [8].

[10]

An injection molded article, comprising the flame-retardant resin composition according to [7] or [8].

Advantages of Invention

The present invention attains a flame-retardant resin composition having high flame retardancy, a good surface appearance, and high productivity. Moreover, for example, by forming the flame-retardant resin composition into a sheet, the present invention can provide a flame-retardant resin film having a good surface appearance, high thickness precision, and high flame retardancy, and a solar battery back sheet containing the flame-retardant resin film.

MODE FOR CARRYING OUT INVENTION

Hereinafter, embodiments for carrying out the present invention (hereinafter, referred to as "the present embodiment") will be described in detail. It is to be noted that the present invention is not limited to the following embodiment, and that various modifications may be made within the range of the gist thereof.

<<Flame-Retardant Resin Film>>

The flame-retardant resin film according to the present embodiment is a flame-retardant resin film obtained by a resin composition, wherein the resin composition contains a polyphenylene ether resin (a), a phosphorus flame retardant (b), and a fluorine-containing resin (c), in the resin composition, the content of the component (a) is 75 to 98 parts by mass and the content of the component (b) is 25 to 2 parts by mass, based on 100 parts by mass of the components (a) and (b) in total, the content of a fluorine element is 100 to 1000 mass ppm in the resin composition, and the flame-retardant resin film has a thickness of 20 to 500 μm.

<<Flame-Retardant Resin Composition>>

The flame-retardant resin composition according to the present embodiment contains a polyphenylene ether resin (a), a phosphate ester flame retardant (b), and an ethylene-tetrafluoroethylene copolymer (c), wherein the content of the component (a) is 75 to 98 parts by mass and the content of the component (b) is 25 to 2 parts by mass, based on 100 parts by mass of the components (a) and (b) in total, and the content of a fluorine element is 100 to 1000 mass ppm.

<Polyphenylene Ether Resin (a)>

First, the component (a), that is, the polyphenylene ether resin will be described. The polyphenylene ether resin (a) is an important component in giving flame retardancy and heat resistance to the flame-retardant resin composition or the flame-retardant film according to the present embodiment.

Examples of the polyphenylene ether resin (a) include polyphenylene ether containing a bonding unit represented by the following formula (1) (hereinafter, also written as "PPE"):

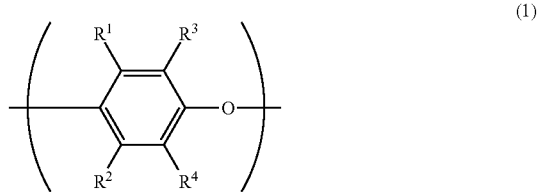

(wherein $R^1$, $R^2$, $R^3$, and $R^4$ each are selected form the group consisting of hydrogen, halogen, a primary or secondary lower alkyl group having 1 to 7 carbon atoms, a phenyl group, a haloalkyl group, an aminoalkyl group, a hydrocarbon oxy group, and a halohydrocarbon oxy group in which a halogen atom and an oxygen atom are separated by at least two carbon atoms, and may be the same or different from each other).

PPE may be a homopolymer or a copolymer as long as the PPE contains the bonding unit represented by the above formula (1).

Specific examples of such PPE are not particularly limited, and include poly(2,6-dimethyl-1,4-phenyleneether), poly(2-methyl-6-ethyl-1,4-phenyleneether), poly(2-methyl-6-phenyl-1,4-phenyleneether), and poly(2,6-dichloro-1,4-phenyleneether). Further examples thereof include polyphenylene ether copolymers such as copolymers of 2,6-dimethylphenol with other phenols (such as 2,3,6-trimethylphenol and 2-methyl-6-butylphenol). Among these, poly(2,6-dimethyl-1,4-phenyleneether) and a copolymer of 2,6-dimethylphenol with 2,3,6-trimethylphenol are preferable, and poly(2,6-dimethyl-1,4-phenyleneether) is more preferable.

The ratio of the monomer units in the copolymer of 2,6-dimethylphenol with 2,3,6-trimethylphenol, for example, is not particularly limited. The unit derived from 2,6-dimethylphenol is preferably 60 to 95 parts by mass, and more preferably 80 to 90 parts by mass, based on 100 parts by mass of the total amount of polyphenylene ether.

The method for producing PPE is not particularly limited; and any known production methods can be used. Examples of the methods include the method according to Hay described in U.S. Pat. No. 3,306,874 in which a complex of a cuprous salt and amine is used as a catalyst, and 2,6-xylenol, for example, is oxidation polymerized. Other examples of the methods include the methods described in U.S. Pat. Nos. 3,306,875, 3,257,357, and 3257358, Japanese Patent Publication No. 52-17880, and Japanese Patent Application Laid-Open Nos. 50-51197 and 63-152628.

The polyphenylene ether resin (a) used for the present embodiment may be used alone, or a mixture of a blend of two or more polyphenylene ether resins may be used. The polyphenylene ether resin (a) may be an entirely or partially modified polyphenylene ether resin.

The modified polyphenylene ether resin refers to a polyphenylene ether resin modified with at least one modifying compound having at least one carbon-carbon double bond or carbon-carbon triple bond and at least one of a carboxylic acid group, an acid anhydride group, an amino group, a hydroxyl group, and a glycidyl group within the molecule structure.

The method for producing the modified polyphenylene ether resin is not particularly limited. Examples thereof include the following methods (1) to (3):
(1) A method in which the polyphenylene ether resin is reacted with the modifying compound in the presence of or in the absence of a radical initiator at a temperature in the range of 100° C. or more and less than a glass transition temperature of the polyphenylene ether resin while the polyphenylene ether resin is controlled not to be molten.
(2) A method in which in the presence of or in the absence of a radical initiator, the polyphenylene ether resin is melt kneaded with the modifying compound and reacted at a temperature in the range of the glass transition temperature of the polyphenylene ether resin or more and 360° C. or less.
(3) A method in which in the presence of or in the absence of a radical initiator, the polyphenylene ether resin is reacted with the modifying compound in a solution at a temperature less than the glass transition temperature of the polyphenylene ether resin.

The reduced viscosity of the polyphenylene ether resin (a) ($\eta sp/c$: 0.5 g/dl, chloroform solution, measured at 30° C.) is not particularly limited. The reduced viscosity is preferably in the range of 0.15 to 0.70 dl/g, more preferably in the range of 0.20 to 0.60 dl/g, and still more preferably in the range of 0.25 to 0.60 dl/g. Here, the reduced viscosity of the polyphenylene ether resin (a) is the reduced viscosity of the blended polymer in the case where a plurality of polyphenylene ether resins having different reduced viscosities are blended and used as the component (a).

Further, as the polyphenylene ether resin (a) used for the present embodiment, a mixture prepared by adding a polystyrene resin to the polyphenylene ether resin at any one of ratios of polyphenylene ether resin/polystyrene resin=30 to 99.9% by mass/70 to 0.1% by mass can also be used.

In the polyphenylene ether resin (a) used for the present embodiment, the amount of the polystyrene resin to be added can be arbitrarily set in the above range. If high flame retardancy and high heat resistance need to be given, the amount of the polystyrene resin to be added is preferably 0.1 to 20% by mass, more preferably 0.1 to 1% by mass, and particularly preferably 0% by mass.

In the resin composition used for the flame-retardant resin film according to the present embodiment or the flame-retardant resin composition according to the present embodiment, the content of the polyphenylene ether resin (a) is 75 to 98 parts by mass, preferably 75 to 95 parts by mass, and more preferably 80 to 95 parts by mass, based on 100 parts by mass of the components (a) and (b) in total from the viewpoints of flame retardancy, heat resistance, and drawdown in molding of the film as the flame-retardant resin composition or from the viewpoints of flame retardancy, heat resistance, low-temperature shrink properties, electrical insulation properties, hydrolysis resistance, and the like as the flame-retardant film.

<Phosphorus Flame Retardant (b)>

Next, the phosphorus flame retardant (b) used for the present embodiment will be described. The phosphorus flame retardant (b) significantly contributes to giving the flame retardancy of the flame-retardant resin composition or flame-retardant film according to the present embodiment combined with a combustion aid effect of the polyphenylene ether resin as the component (a).

The phosphorus flame retardant (b) is not particularly limited as long as the phosphorus flame retardant (b) can be blended with the component (a). Examples thereof include organophosphate ester compounds, phosphazene compounds, red phosphorus, phosphinate salts, phosphonate salts, and phosphoramide compounds. Blending the phosphorus flame retardant (b) can improve particularly flame retardancy and molding fluidity of the flame-retardant film according to the present embodiment. Among these, from the viewpoint of a flame retardancy giving effect and no halogen, the component (b) preferably contains the phosphate ester flame retardant. Further, more preferably, the component (b) contains at least one selected from the group consisting of condensed phosphate esters represented by the following formula (I) and the following formula (II) as the main component. Here, the "main component" indicates that 90% by mass or more of the component is contained.

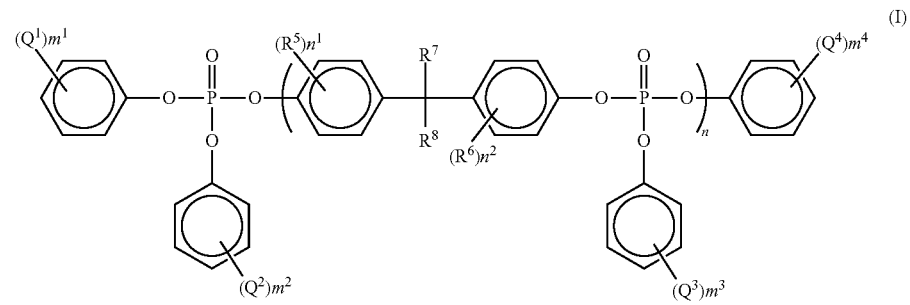

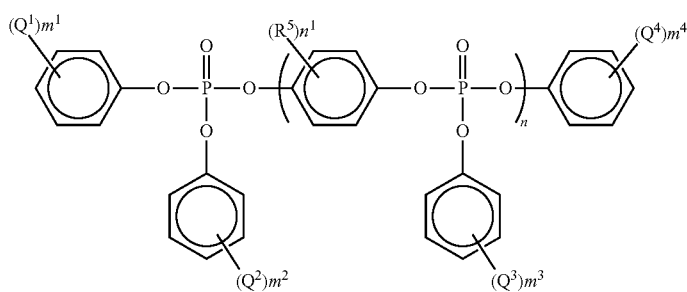

(II)

wherein $Q^1$, $Q^2$, $Q^3$, and $Q^4$ each are substituents and each independently represent an alkyl group having 1 to 6 carbon atoms; $R^5$ and $R^6$ each are substituents and represent a methyl group; $R^7$ and $R^8$ each independently represent a hydrogen atom or a methyl group; n represents an integer of 0 or more; $n^1$ and $n^2$ each independently represent an integer of 0 to 2; $m^1$, $m^2$, $m^3$, and $m^4$ each independently represent an integer of 0 to 3.

The condensed phosphate esters represented by the above formulae (I) and (II) are composed of a plurality of molecular chains. n in the respective molecules is an integer of 0 or more, and preferably 1 to 3. Preferably, n has an average value of 1 or more as a whole.

Among these, more preferable are condensed phosphate esters wherein $m^1$, $m^2$, $m^3$, $m^4$, $n^1$, and $n^2$ in the formula (I) is 0, and $R^7$ and $R^8$ are a methyl group; and condensed phosphate esters wherein $Q^1$, $Q^2$, $Q^3$, $Q^4$, $R^7$, and $R^8$ in the formula (I) is a methyl group, $n^1$ and $n^2$ are 0, $m^1$, $m^2$, $m^3$, and $m^4$ are an integer of 1 to 3, these condensed phosphate esters containing 50% by mass or more of a phosphate ester wherein n is an integer of 1 to 3, and particularly 1. Such condensed phosphate esters are preferable because these have low volatility during molding process.

For the component (b), commercially available typical phosphorus flame retardants can be used. Commercially available typical phosphorus flame retardants are not particularly limited, and examples thereof can include condensed phosphate ester flame retardants such as trade names "CR-741," "CR733S," and "PX-200" made by DAIHACHI CHEMICAL INDUSTRY CO., LTD.

The components (b) may be used singly or in combinations of two or more thereof.

In the resin composition used for the flame-retardant resin film according to the present embodiment or the flame-retardant resin composition according to the present embodiment, the content of the component (b) is in the range of 25 to 2 parts by mass, preferably 25 to 5 parts by mass, and more preferably 20 to 5 parts by mass, based on 100 parts by mass of the components (a) and (b) in total from the viewpoint of flame retardancy, mechanical physical properties, surging and draw-down during molding a film as the flame-retardant resin composition. At a content of the component (b) of 2 parts by mass or more, the flame-retardant resin film or flame-retardant resin composition can have improved flame retardancy. At a content of 25 parts by mass or less, the flame-retardant resin composition can have improved heat resistance, impact resistance, and surging and draw-down during molding a film.

<Fluorine-Containing Resin (c)>

Next, the component (c) used for the present embodiment will be described. The component (c) is a resin containing a fluorine atom (fluorine-containing resin) that contributes to the effects of improving the surface appearance of the flame-retardant resin composition, and processability and thickness precision during molding a flame-retardant resin film.

Particularly, the component (c) preferably contains at least one selected from the group consisting of homopolymers of fluoroethylene, copolymers of fluoroethylene, and copolymers of olefin and fluoroethylene. Such a component (c) contained in the flame-retardant resin composition can give the flame-retardant resin composition high dropping prevention properties during burning, a good surface appearance, and the effect of improving productivity and yield by preventing the wire mesh from being clogged. The component (c) can also improve the film forming processability of the flame-retardant resin film, and the flame retardancy (dropping prevention properties during burning) of the solar battery back sheet using the flame-retardant resin film.

Specific examples of the component (c) can include polymonofluoroethylene, polydifluoroethylene, polytrifluoroethylene, polytetrafluoroethylene, and tetrafluoroethylene-hexafluoropropylene copolymers. Among these, polytetrafluoroethylene is preferable. The component (c) may be a copolymer obtained by copolymerizing the fluorine-containing monomer in combination with a monomer copolymerizable therewith when necessary, or may be an olefin-fluoroethylene copolymer that is a copolymer of olefin and fluoroethylene. Among these, the component (c) is preferably olefin-fluoroethylene copolymers. Specific examples of olefin-fluoroethylene copolymers include ethylene-tetrafluoroethylene copolymers, ethylene-trifluoroethylene copolymers, and propylene-tetrafluoroethylene copolymers. Ethylene-tetrafluoroethylene copolymers are preferable.

The method for producing these fluorine-containing resins (c) is not particularly limited. Examples of the method include the production methods described in U.S. Pat. Nos. 2,393,697 and 2,534,058. Specifically, for example, tetrafluoroethylene is polymerized in an aqueous medium under an increased pressure of 7 to 70 kg/cm$^2$ at a temperature of 0 to 200° C. using a radical initiator such as ammonium persulfate and potassium persulfate. Next, the resultant suspension, dispersion liquid, or emulsion is flocculated or deposited to obtain a polytetrafluoroethylene powder.

Commercially available products of polytetrafluoroethylene are not particularly limited, and examples thereof can include Teflon (registered trademark) made by Du Pont-Mitsui Fluorochemicals Company, Ltd., Polyfron (registered trademark) made by DAIKIN INDUSTRIES, LTD., and Fluon (registered trademark) PTFE made by ASAHI GLASS CO., LTD. Commercially available products of an aqueous dispersion liquid of polytetrafluoroethylene (hereinafter, also written as "PTFE") are not particularly limited.

Typical examples thereof can include Teflon (registered trademark) 31JR made by Du Pont-Mitsui Fluorochemicals Company, Ltd.

Further, polydifluoroethylene is not particularly limited, and examples thereof include KF polymer (registered trademark) made by KUREHA CORPORATION, KYNAR (registered trademark) made by Arkema S.A., and Hylar (registered trademark) made by Solvay Solexis S.p.A. Polymonofluoroethylene is not particularly limited, and examples thereof include Tedlar (registered trademark) made by E. I. du Pont de Nemours and Company.

The tetrafluoroethylene-hexafluoropropylene copolymer is not particularly limited, and examples thereof can include Teflon (registered trademark) FEP made by Du Pont-Mitsui Fluorochemicals Company, Ltd., and Neofron (registered trademark) FEP made by DAIKIN INDUSTRIES, LTD.

Further, a mixture of a fluorine resin and another resin can also be used as the component (c) used for the present embodiment to improve the dispersibility of the component (c) in the resin composition and further attain a good suppressing effect on dropping during burning.

Examples of the method for producing a mixture of polytetrafluoroethylene and another resin include the following methods (1) to (5):
(1) A method in which an aqueous dispersion liquid of polytetrafluoroethylene is mixed with an aqueous dispersion liquid or solution of an organic polymer, and the resultant solution is coprecipitated to obtain a co-agglomerated mixture (methods described in Japanese Patent Application Laid-Open Nos. 60-258263, 63-154744, and others).
(2) A method in which an aqueous dispersion liquid of polytetrafluoroethylene is mixed with a dried organic polymer particle (method described in Japanese Patent Application Laid-Open No. 04-272957).
(3) A method in which an aqueous dispersion liquid of polytetrafluoroethylene is uniformly mixed with an organic polymer particle solution, and the media are removed from the mixture simultaneously (methods described in Japanese Patent Application Laid-Open Nos. 06-220210, 08-188653, and others).
(4) A method in which a monomer that forms an organic polymer is polymerized in an aqueous dispersion liquid of polytetrafluoroethylene (method described in Japanese Patent Application Laid-Open No. 09-95583).
(5) A method in which an aqueous dispersion liquid of polytetrafluoroethylene is uniformly mixed with an organic polymer dispersion liquid; further a vinyl monomer is polymerized in the mixed dispersion liquid; subsequently a mixture is obtained (methods described in Japanese Patent Application Laid-Open No. 11-29679 and others).

Commercially available products of these mixed polytetrafluoroethylenes are not particularly limited, and examples thereof include "METABLEN A3800" (trade name) made by MITSUBISHI RAYON CO., LTD.

A copolymer of a fluorine resin and another resin can also be used as the component (c) used for the present embodiment. Specifically, examples of the copolymers include ethylene-tetrafluoroethylene copolymers and ethylene-tetrafluoroethylene-hexafluoropropylene copolymers. Commercially available products of these copolymers are not particularly limited, and examples thereof can include Neofron (registered trademark) ETFE and EFEP made by DAIKIN INDUSTRIES, LTD., and Fluon LM-ETFE (registered trademark) made by ASAHI GLASS CO., LTD.

In the present embodiment, in the case where the olefin-fluoroethylene copolymer is used as the component (c), preferably the MFR value and the specific gravity are controlled to fall within specific ranges.

The MFR value of the olefin-fluoroethylene copolymer is in the range of preferably 10 to 40 g/10 min, more preferably 13 to 37 g/10 min, and still more preferably 15 to 35 g/10 min. The specific gravity of the olefin-fluoroethylene copolymer is in the range of preferably 1.74 to 1.79, and more preferably 1.74 to 1.76.

The olefin-fluoroethylene copolymer controlled to have the MFR value of 10 to 40 g/10 min, for example, and the specific gravity of 1.74 to 1.79, for example, can be uniformly and finely dispersed in the flame-retardant resin composition. As a result, the flame-retardant resin composition to be obtained can have a better surface appearance, and clogging of the wire mesh during processing the flame-retardant resin composition can be improved. Moreover, during burning the flame-retardant resin composition, the burning time can be improved and the dropping can be prevented.

The content of the fluorine-containing resin (c) in the resin composition used for the flame-retardant resin film according to the present embodiment or the flame-retardant resin composition according to the present embodiment is adjusted considering the content of a fluorine element described later.

<Content of Fluorine Element>

The flame-retardant resin composition according to the present embodiment or the resin composition used for the flame-retardant resin film according to the present embodiment has a content of a fluorine element of 100 to 1000 mass ppm, preferably 100 to 800 mass ppm, and still more preferably 120 to 500 mass ppm.

At a content of the fluorine element of 100 to 1000 mass ppm, the fluorine-containing resin (c) can be uniformly and finely dispersed in the flame-retardant resin composition, and clogging of the wire mesh during processing the flame-retardant resin composition can be improved. Moreover, surging and draw-down during molding the flame-retardant resin film can be suppressed. As a result, the flame-retardant resin film to be obtained has a uniform thickness (high thickness precision) even if the film is thin. Particularly, in the case where the olefin-fluoroethylene copolymer is used as the fluorine-containing resin (c), at a content of the fluorine element of 100 to 1000 mass ppm, the flame retardancy of the flame-retardant resin film to be obtained tends to be improved more significantly.

Examples of the method of controlling the content of the fluorine element to be 100 to 1000 ppm include a method in which the blending amount of the fluorine-containing resin (c) in the resin composition is adjusted based on the content of the fluorine element in the fluorine-containing resin (c) used. Specifically, for example, in the case where polytetrafluoroethylene (content of the fluorine element of 76% by mass) is used as the component (c), the content of the fluorine element in the resin composition used for the flame-retardant resin composition or the flame-retardant resin film can be 100 to 1000 ppm if the content of polytetrafluoroethylene in the resin composition is controlled to be 0.013 to 0.132%. Moreover, for example, in the case where the ethylene-tetrafluoroethylene copolymer is used as the component (c), the ethylene-tetrafluoroethylene copolymers in different grades have different ethylene/tetrafluoroethylene ratios. For this reason, first, the fluorine element in the component (c) is analyzed with reference to the specific gravity of the component (c). Next, based on the analysis, the content of the fluorine element in the component (c) is calculated. Then, the blending amount of the component (c) is adjusted with reference to the calculated content of the fluorine element. Thereby, the content of the fluorine element in the resin composition used for the flame-retardant resin composition or flame-retardant resin film can be controlled to be 100 to 1000 ppm.

In the present embodiment, the content of the fluorine element can be determined by analyzing the resin composition or the resin film. In this case, the content may be determined according to JPCA-ES01-2003.

<Elastomer (d)>

Preferably, the flame-retardant resin composition according to the present embodiment or the resin composition used for the flame-retardant resin film according to the present embodiment further contains an elastomer (d).

In the flame-retardant resin composition according to the present embodiment or the resin composition used for the flame-retardant resin film according to the present embodiment, the content of the component (d) is preferably 1 to 25 parts by mass, more preferably 1 to 11 parts by mass, and still more preferably 1 to 9 parts by mass, based on 100 parts by mass of the components (a) and (b) in total.

The component (d) contained in the specific range of the content can improve the impact resistance and moldability of the flame-retardant resin composition, the flame-retardant resin film, and the solar battery back sheet containing the flame-retardant resin film particularly. In the case where the component (d) is added, the amount of the component (c) to be added is properly adjusted such that 100 to 1000 mass ppm of the fluorine element is contained in all the components (a) to (d), namely, in the resin composition used for the flame-retardant resin composition or the flame-retardant resin film.

The elastomer (d) is not particularly limited, and examples thereof include thermoplastic elastomers. Specifically, examples thereof include elastomers formed in a vinyl aromatic compound and a conjugated diene compound. Among these, the elastomer (d) is preferably block copolymers containing at least one polymer block A mainly containing a vinyl aromatic compound and at least one polymer block B mainly containing a conjugated diene compound, more preferably hydrogenated block copolymers obtained by hydrogenating these (hereinafter, also simply abbreviated to the "hydrogenated block copolymer") from the viewpoint of heat resistance and impact resistance.

The examples of the hydrogenated block copolymer include a hydrogenated block copolymer obtained by hydrogenating a block copolymer having a structure such as A-B, A-B-A, B-A-B-A, (A-B-)4-Si, and A-B-A-B-A and containing 5 to 95% by mass, and preferably 10 to 80% by mass of a bonded vinyl aromatic compound. Here, A represents the polymer block A, and B represents the polymer block B.

Next, the block structure will be described. The polymer block A mainly containing a vinyl aromatic compound has a structure of a homopolymer block of a vinyl aromatic compound or a copolymer block of a vinyl aromatic compound and a conjugated diene compound in which preferably more than 50% by mass, and still more preferably 70% by mass or more of the vinyl aromatic compound is contained. The polymer block B mainly containing a conjugated diene compound has a structure of a homopolymer block of a conjugated diene compound or a copolymer block of a conjugated diene compound and a vinyl aromatic compound in which preferably more than 50% by mass, and more preferably 70% by mass or more of the conjugated diene compound is contained.

The polymer block A mainly containing a vinyl aromatic compound and the polymer block B mainly containing a conjugated diene compound have distribution of the conjugated diene compound and that of the vinyl aromatic compound in the chain in the polymer block, respectively, whose distribution may be random, tapered (the monomer component increases or decreases along the chain), partially blocked, or any combination thereof. In the case where two or more polymer blocks mainly containing a vinyl aromatic compound and two or more polymer blocks mainly containing a conjugated diene compound exist, the two or more polymer blocks may have the same structure or different structures.

The vinyl aromatic compound that forms the block copolymer is not particularly limited. For example, one or two or more can be selected from styrene, α-methylstyrene, vinyl toluene, p-tert-butylstyrene, diphenylethylene, and the like. Among these, styrene is preferable. The conjugated diene compound is not particularly limited. For example, one or two or more are selected form butadiene, isoprene, 1,3-pentadiene, 2,3-dimethyl-1,3-butadiene, and the like. Among these, butadiene, isoprene, and a combination thereof are preferable. The polymer block mainly containing a conjugated diene compound can have an arbitrarily selected microstructure of the bonding form of the block. For example, in the polymer block mainly containing butadiene, 2 to 90% of 1,2-vinyl bonds is preferable, and 8 to 80% thereof is more preferable. In the polymer block mainly containing isoprene, the total amount of 1,2-vinyl bonds and 3,4-vinyl bonds is preferably 2 to 80%, and more preferably 3 to 70%.

The number average molecular weight of the hydrogenated block copolymer that is a constituting element of the component (d) used in the present embodiment is in the range of preferably 5,000 to 1,000,000, and particularly preferably 20,000 to 500,000. The molecular weight distribution [the ratio of the weight average molecular weight (Mw) to the number average molecular weight (Mn)] is preferably 10 or less. Further, the hydrogenated block copolymer may have any molecule structure that is linear, branched, radial, or any combination thereof. In the present embodiment, the weight average molecular weight (Mw) and the number average molecular weight (Mn) are values measured by gel permeation chromatography and converted in terms of polystyrene.

The hydrogenated block copolymer having the structure above can be obtained by hydrogenating the aliphatic double bond of the polymer block B mainly containing a conjugated diene compound in the block copolymer. The hydrogenated block copolymer having the structure above can be used as the hydrogenated block copolymer in the component (d) used in the present embodiment. The hydrogenation rate of the aliphatic double bond is preferably at least more than 20%, more preferably 50% or more, and particularly preferably 80% or more.

The hydrogenation rate can be known using a nuclear magnetic resonance apparatus (NMR) or the like.

For the hydrogenated block copolymer used in the present embodiment, a block copolymer can also be used in which at least one functional group selected from a hydroxyl group, a carboxyl group, an acid anhydride group, an ester group, an epoxy group, an oxazolyl group, and an amino group is added to the hydrogenated block copolymer obtained by hydrogenating the block copolymer containing at least one polymer block A mainly containing a vinyl aromatic compound and at least one polymer block B mainly containing a conjugated diene compound.

For the hydrogenated block copolymer, a mixture of a hydrogenated block copolymer having 55 to 95% by mass of a bonded vinyl aromatic compound with a hydrogenated block copolymer having 1 to less than 55% by mass of a bonded vinyl aromatic compound can also be used. Use of the mixture containing 20 to 55% by mass of the bonded vinyl aromatic compound as the component (d) is preferable from the aspect of the balance between compatibility with PPE and toughness.

In the case where it is desired to use the hydrogenated block copolymer as the component (d), the content of the hydrogenated block copolymer is 1 to 25 parts by mass, preferably 1 to 11 parts by mass, more preferably 1 to 9 parts by mass, based on 100 part by weight of the components (a) and (b) in total from the viewpoint of toughness, flame retardancy, heat resistance, and draw-down during molding a film as the flame-retardant resin composition or flame-retardant resin film.

<Other Components>

Further, besides the components described above, other additional components may be added to the flame-retardant resin composition according to the present embodiment or the resin composition used for the flame-retardant resin film according to the present embodiment when necessary in the range in which the features and effects of the present invention are not impaired. Examples of such other components include an antioxidant, a metal deactivator, a plasticizer (such as mineral oil, low molecular weight polyethylene, epoxyfied soybean oil, polyethylene glycol, and fatty acid esters), a flame retardant aid, a weatherability (light stability) improver (such as benzophenone ultraviolet absorbing agents, benzotriazole ultraviolet absorbing agents, and hindered amine light stabilizers), a slipping agent, an inorganic or organic filler or reinforcing material (such as polyacrylonitrile fibers and aramide fibers), a variety of colorants (such as carbon black and titanium oxide), and a mold release agent.

Among these, a variety of stabilizers are preferably used when a process is needed at a temperature of 250° C. or more. The stabilizers are not particularly limited, and known stabilizers can be used. Examples of the stabilizer include organic stabilizers such as hindered phenol stabilizers, phosphorus stabilizers, and hindered amine stabilizers; and inorganic stabilizers such as copper oxide and zinc oxide. The blending amount of the stabilizer is preferably in the range of 5 parts by mass or less based on 100 parts by mass of the components (a) and (b) in total.

The flame-retardant resin composition, flame-retardant resin film, and solar battery back sheet according to the present embodiment need weatherability (light stability) in particular when these are used for the solar battery module installed outdoors, for example. In such a case, 0.01 to 5 parts by mass of at least one weatherability improver selected from ultraviolet absorbing agents and hindered amine stabilizers is preferably blended with the flame-retardant resin composition according to the present embodiment or the resin composition used for the flame-retardant resin film according to the present embodiment based on 100 parts by mass of the components (a) and (b) in total.

Further, other resins may be contained in the flame-retardant resin composition according to the present embodiment or the resin composition used for the flame-retardant resin film according to the present embodiment when necessary in the range in which the effects of the application are not impaired. The other resins are not particularly limited, and examples thereof include polyarylene sulfide (PAS), polyamide (PA), polyether ether ketone (PEEK), polyether imide (PEI), and polyethersulfone (PES). These resins can be used alone, or can be used by mixing two or more thereof.

Further, a compatibilizer may be contained in the resin composition used for the flame-retardant resin film according to the present embodiment or the flame-retardant resin composition according to the present embodiment. The compatibilizer may be any polyfunctional compound interactive with the components (a) to (d) or three thereof, and is not particularly limited. This interaction may be chemical interaction (such as grafting) or physical interaction (such as change in surface properties of the dispersed phase). The compatibilizer is not particularly limited, and examples thereof include maleic anhydride.

Further, an inorganic filler can be added to the resin composition used for the flame-retardant resin film according to the present embodiment or the flame-retardant resin composition according to the present embodiment when necessary. The inorganic filler is not particularly limited as long as addition of the inorganic filler can give strength of the flame-retardant resin film or flame-retardant resin composition. Examples thereof include inorganic compounds such as glass fibers, metal fibers, potassium titanate, carbon fibers, silicon carbide, ceramics, silicon nitride, mica, nepheline syenite, talc, wollastonite, slag fibers, ferrite, glass beads, glass powders, glass balloon, quartz, quartz glass, fused silica, titanium oxide, and calcium carbonate. Among these, glass fibers, glass flakes, mica, and talc are more preferable from the viewpoint of moldability, dimensional accuracy, and stability when the flame-retardant resin film is formed. The shapes of these inorganic fillers are not limited, and a fibrous shape, a plate-like shape, a spherical shape, and the like can be arbitrarily selected. A plate-like shape and a spherical shape are preferable from the viewpoint of the moldability and dimensional accuracy of the flame-retardant resin film and the stability when the flame-retardant resin film is formed. These inorganic fillers can also be used in combination. Further, an inorganic filler surface treated with a silane coupling agent, a titanate coupling agent, or the like and conversed with a urethane resin, an epoxy resin, or the like can be suitably used, when necessary.

<Method for Producing Flame-Retardant Resin Composition>

The method for producing the flame-retardant resin composition according to the present embodiment is not particularly limited, and examples thereof include a method of melt kneading the components above using various melt kneaders. The melt kneader that performs these methods is not particularly limited, and examples thereof include heat and melt kneaders such as single screw extruders, multi screw extruders including twin screw extruders, rolls, kneaders, Brabender Plastographs, and Banbury mixers. Among these, a method of melt kneading the components above using a twin screw extruder is preferable as the method for producing the flame-retardant resin composition according to the present embodiment. Specific examples of the twin screw extruder are not particularly limited, and examples thereof include ZSK series made by WERNER & PFLEIDERER GmbH & Co. KG, TEM series made by TOSHIBA MACHINE CO., LTD., and TEX series made by The Japan Steel Works, Ltd.

A preferable aspect of the method for producing the flame-retardant resin composition according to the present embodiment using an extruder will be described below. The L/D (barrel effective length/barrel inner diameter) of the extruder is in the range of preferably 20 or more and 60 or less, and more preferably 30 or more and 50 or less. Preferably, the extruder contains a first raw material feeding port provided upstream of the flow direction of the raw material, a first vacuum vent provided downstream of the first raw material feeding port, second to fourth raw material feeding ports provided downstream of the first vacuum vent, and a second vacuum vent provided downstream of the second to fourth raw material feeding ports. Among these, a more preferable extruder is those containing a kneading section provided upstream of the first vacuum vent, a kneading section provided between the first vacuum vent and the second raw material feeding port, and a kneading section provided between the second to fourth raw material feeding ports and the second vacuum vent. The method of feeding a raw material to the second to fourth raw material feeding ports is not particularly limited. For example, a method of feeding a raw material from a side opening port of the extruder using a forcing side feeder is more stable than and preferable to the method of adding and feeding a raw material from opening ports of the second to fourth raw material feeding ports of the extruder. Particularly in the case where the flame-retardant resin composition according to the present embodiment contains a large amount of powder, to reduce generation of crosslinked products or carbonized substances derived from the thermal history of the resin, a method of feeding a raw material from the side of the extruder using a forcing side feeder is more preferable, and a method of providing forcing side feeders in the second to fourth raw material feeding ports and feeding divided portions of the powder is more preferable. In the case where a liquid raw material is added, a method of adding the liquid raw material into the extruder using a plunger pump, a gear pump, or the like is preferable. Additionally, the upper opening ports of the second to fourth raw material feeding ports in the extruder can be provided as opening ports for discharging air conveyed with the raw material. At this time, the melt kneading temperature and the number of rotation of the screw are not particularly limited. Typically, the melt kneading temperature can be arbitrarily selected from 300 to 350° C., and the number of rotation of the screw can be arbitrarily selected from 100 to 1200 rpm.

Further, in the case where it is desired to reduce the crosslinked products or carbonized substances derived from the thermal history of the resin in the presence of oxygen, the concentration of oxygen in a passage for adding the raw materials to the extruder is preferably kept less than 1.0% by volume. Specifically, the passage is composed of the step lines from a stock tank, a pipe, a gravimetric feeder having a refill tank, a pipe, a feed hopper, to a twin screw extruder. Examples of the method of keeping the concentration of oxygen include a method of introducing an inert gas into the respective step lines having increased airtightness. Typically, nitrogen gas can be introduced into the respective step lines having increased airtightness to keep the concentration of oxygen less than 1.0% by volume.

Preferably, nitrogen gas is fed into the feeding passage having increased airtightness to control the concentration of oxygen in the raw material feed line of the twin screw extruder to be less than 1.0% by volume. The concentration of oxygen can be measured with an oxygen meter installed in the raw material feeding passage (such as a digital oxygen meter XO-326ALA made by New Cosmos Electric Co., Ltd.). The entire raw material feeding passage preferably has increased airtightness to control the concentration of oxygen to be less than 1.0% by volume. A gas to be discharged generates because of the volume of the raw material itself in the space of the passage in which the raw material is dropped from above and fed. For this reason, a venting exhaust pipe is preferably provided in the space. Namely, the venting exhaust pipe is preferably provided to prevent continuously fed nitrogen gas from increasing the pressure of the raw material feeding passage having increased airtightness. Specifically, the venting exhaust pipe is provided in the upper portion of the space inside of the refill tank for the gravimetric feeder to which the raw material drops from the stock tank and the upper portion of the space of the hopper to which the raw material drops from the gravimetric feeder. A tendency is shown such that control of the concentration of oxygen to be less than 1.0% by volume can reduce the total number of black dot foreign substances in the flame-retardant resin composition to be obtained. Among these, control of the concentration of oxygen to be less than 0.3% by volume is more preferable.

The production method described above attains the effect of dramatically reducing residues on screw in the twin screw extruder when the flame-retardant resin composition using a powdery polyphenylene ether resin is produced with the twin screw extruder. Further, the production method attains the effect of reducing black dot foreign substances and carbonized substances contained in the flame-retardant resin composition obtained by the method.

The number of black dot foreign substances and carbonized substances in the flame-retardant resin composition can be measured as follows: the flame-retardant resin composition is dissolved in chloroform, the obtained solution is filtered, and the number of foreign substances on the filter paper is counted. If a large amount of a chloroform-insoluble content is contained and filtration of foreign substances is impossible, the number of black dot foreign substances and carbonized substances in the flame-retardant resin composition is measured as follows: a flat plate of the flame-retardant resin composition is formed by heat press molding, and the number of foreign substances in the flat plate is counted. The number of these foreign substances is preferably 0 to 40, more preferably 0 to 30, and still more preferably 0 to 20 from the viewpoint of the mechanical strength and surface appearance (projections and depressions on the surface, prominent light brown to black dots, and the like) of the resin molded body when the flame-retardant resin composition is used as the resin molded body.

Examples of the method for producing the flame-retardant resin composition according to the present embodiment include a method of melt kneading components according to one of the following methods 1 to 3 using an extruder in which the concentration of oxygen in each raw material feeding port is controlled to be less than 1.0% by volume.

1. A method in which part or the whole amount of the component (a) and the component (c), or when necessary the component (d) are fed from the first feeding port; next, the remaining component (a) is fed from the second feeding port and the component (b) are fed from the third feeding port under a melt kneaded state; further, melt kneading is successively performed.

2. A method in which the whole amounts of the component (a) to the component (c), or when necessary the whole amount of the component (d) is fed from the first feeding port, and melt kneaded.

3. A method in which the component (a) and the component (c) are fed from the first raw material feeding port; next, when necessary the component (d) is fed from the second feeding port and the component (b) is fed from the third feeding port under a melt kneaded state, and melt kneading is performed.

Particularly, in the flame-retardant resin composition to be obtained by the production method 1, the component (a) to the component (d) can be more uniformly dispersed in a better state of each component to more significantly exhibit the effect of blending these components than in the case of the flame-retardant resin composition to be obtained by the production method 2 or 3. Specifically, the production method 1 is more preferable because generation of cross-linked products and carbonized substances derived from the thermal history of the resin can be suppressed, the drawdown of the flame-retardant resin during molding a film, clogging of the mesh and die drop can be significantly reduced, and a flame-retardant resin composition having high flame retardancy and a good surface appearance can be obtained.

The resin pellet according to the present embodiment contains the flame-retardant resin composition above. Moreover, the resin pellet according to the present embodiment is obtained, for example, by pelletizing the flame-retardant resin composition obtained by the production method above.

The injection molded article according to the present embodiment contains the flame-retardant resin composition above. Moreover, the injection molded article according to the present embodiment can be obtained, for example, by injection molding the flame-retardant resin composition. The method for injection molding is not particularly limited, and known methods can be used.

<Method for Producing Flame-Retardant Resin Film>

The flame-retardant resin film according to the present embodiment can be produced, for example, by molding the flame-retardant resin composition above.

The flame-retardant resin film according to the present embodiment can also be obtained, for example, by directly charging the components above into an extrusion film molding machine, and performing kneading and molding of a film at the same time.

The flame-retardant resin film according to the present embodiment can also be produced, for example, by T die extrusion molding the flame-retardant resin composition above. In this case, the obtained flame-retardant resin film may be used without stretching, may be uniaxially stretched, or may be biaxially stretched. In the case where it is desired to enhance the strength of the flame-retardant resin film, it can be attained by stretching. Moreover, by a multi-layer T die extrusion molding method, a multi-layer sheet of the flame-retardant resin film according to the present embodiment and another resin film can be obtained.

The flame-retardant resin film according to the present embodiment can also be produced, for example, by an extrusion tubular method, which is called an inflation method in some cases. In the extrusion tubular method or inflation method, to prevent the parison coming out of a cylinder from immediately be cooled, the temperature of the parison is preferably selected from the temperature range of 50 to 290° C. properly and controlled to attain a uniform thickness of the flame-retardant resin film. By the inflation method using a multi-layer die, a multi-layer sheet of the flame-retardant resin film according to the present embodiment and another resin film can also be obtained. Upon molding the film, the molding machine controlled to have the concentration of oxygen less than 1% is preferably used because black dot foreign substances and carbonized substances derived from the thermal history of the resin in the presence of oxygen can be reduced.

The number of black dot foreign substances and carbonized substances in the flame-retardant resin film can be measured as follows: the flame-retardant resin film is dissolved in chloroform, the obtained solution is filtered, and the number of foreign substances on the filter paper is counted. The number of foreign substances is preferably 0 to 60, more preferably 0 to 40, and still more preferably 0 to 30 from the viewpoint of the mechanical strength, processability (such as bending properties and adhesion of the film to a sealing material), and surface appearance when the flame-retardant resin composition is used as the flame-retardant resin film.

<Thickness of Flame-Retardant Resin Film>

The thickness of the flame-retardant resin film according to the present embodiment is 20 to 500 μm, and preferably 50 to 250 μm. The flame-retardant resin film has a thickness of 20 μm as the lower limit value and a thickness of 500 μm as the upper limit value from the viewpoint of the mechanical strength and processability (such as bending properties) when the flame-retardant resin composition is used as the flame-retardant resin film.

Next, the thickness of the flame-retardant resin film precision will be described. The standard deviation of the thickness of the flame-retardant resin film is preferably 0 to 15, more preferably 0 to 12, and still more preferably 0 to 9 from the viewpoint of the mechanical strength, processability (such as bending properties and adhesion of the film to a sealing material) when the flame-retardant resin composition is used as the flame-retardant resin film, and the thickness of the flame-retardant resin film precision after the process. The standard deviation of the thickness of the flame-retardant resin film can be obtained, for example, by the measurement method using a microgauge as described later in Examples. In the case where the flame-retardant resin film is closely bonded to another layer (such as a sealing material and a gas barrier layer), the standard deviation of the thickness can be obtained by the method in which a flame-retardant resin film layer is photographed using an electron microscope or the like, and the film thickness is measured.

<Application>

The flame-retardant resin film according to the present embodiment can be used for a solar battery back sheet. The flame-retardant resin film according to the present embodiment can also be used for other applications in which properties such as heat resistance, flame retardancy, and electrical insulation properties are required. In other applications, for example, the flame-retardant resin film according to the present embodiment can be suitably used for insulation films as print substrate materials, print substrate peripheral parts, semiconductor packages, magnetic tapes for data, APS photograph films, film capacitors, insulation films, insulation materials for motors and transducers, speaker vibration plates, film sensors for automobiles, insulation tapes for wire cable, TAB tapes, generator slot liner interlayer insulation materials, toner agitators, electronic and electrical part materials such as insulation washer for lithium ion batteries, materials for home appliances OA, materials for automobiles, industrial materials, and the like.

<<Solar Battery Back Sheet>>

The solar battery back sheet according to the present embodiment contains the flame-retardant resin film above.

In the solar battery back sheet according to the present embodiment, the thickness of the flame-retardant resin film can be properly selected considering the performance of the solar battery back sheet or the like. Preferably, the thickness is 20 to 500 μm.

The flame-retardant resin film used for the solar battery back sheet according to the present embodiment is preferably a film having high surface smoothness (having dimensional accuracy), and having a few defects or foreign substances. If the flame-retardant resin film has high surface smoothness, the solar battery back sheet can uniformly have flame retardancy and weatherability. Meanwhile, if the flame-retardant resin film has many defects or foreign substances, the solar battery back sheet tends to exhibit reduction in partial discharge voltage to be required.

The surface smoothness of the flame-retardant resin film can be evaluated based on the insoluble fraction (%) relative to the solvent that can dissolve the flame-retardant resin film, such as chloroform. Namely, at an insoluble fraction of 1% or less, it can be determined that the surface smoothness of the flame-retardant resin film is good. Preferably, the insoluble fraction is 0.5% or less. Further, the foreign substances generated by the decomposition reaction or the like are left on the filter paper from the filtration component in chloroform. Preferably, the foreign substances in the flame-retardant resin film are not substantially observed because these foreign substances cause reduction in partial discharge voltage in the solar battery back sheet.

In the flame-retardant resin film that forms the solar battery back sheet according to the present embodiment, the film having a thickness in the range of 20 to 500 μm preferably has VTM-0 in the burning test according to UL94. It is inevitably expected that the solar battery back sheet according to the present embodiment containing such a flame-retardant resin film has improved flame retardancy. The solar battery back sheet according to the present embodiment containing such a flame-retardant resin film tends to attain VTM-0 in the burning test according to UL94.

In the present embodiment, the burning test according to UL94 is specifically the flame retardancy test later described in Examples.

For the solar battery back sheet according to the present embodiment, a layer formed of the flame-retardant resin film, and when necessary a layer such as a gas barrier layer and a light stable layer are laminated, for example, as described later. Then, the solar battery back sheet according to the present embodiment, a light transmittive substrate, a sealing material layer, and a solar battery element are laminated, and subjected to a heat vacuum lamination method, for example, as described later. Thus, a solar battery module can be produced. The heating temperature in the vacuum lamination method is usually in the temperature range of 140 to 160° C. For this reason, preferably, the respective layers that form the solar battery back sheet are not molten or deformed in this temperature range.

In the solar battery back sheet according to the present embodiment, the polyphenylene ether resin (a) contained in the flame-retardant resin film is a non-crystalline resin. For this reason, the heat resistance of the solar battery back sheet according to the present embodiment can be evaluated using the glass transition temperature (Tg) of the flame-retardant resin film that forms the solar battery back sheet. The glass transition temperature in the DSC measurement of the flame-retardant resin film is preferably 140° C. or more, and more preferably 150° C. or more. The upper limit of the glass transition temperature of the resin film is not particularly limited, and for example, is 205° C. or less. At a glass transition temperature of the flame-retardant resin film of 140° C. or more, melting and deformation of the flame-retardant resin film in the heat vacuum lamination step can be suppressed. The glass transition temperature of the flame-retardant resin film can be controlled by the blending amounts (parts by mass) of mainly the polyphenylene ether resin (a) and the phosphorus flame retardant (b). If the blending amount of the polyphenylene ether resin (a) is large, the glass transition temperature of the flame-retardant resin film will be higher to provide a solar battery back sheet having improved heat resistance. The glass transition temperature of the flame-retardant resin film is measured by observing transition points in the chart in the DSC measurement.

<Other Layers that Form Solar Battery Back Sheet>

The solar battery back sheet according to the present embodiment may be composed of a single layer formed of the flame-retardant resin film above only, or may have a multi-layer structure composed of two or more layers. Examples of the multi-layer structure include a structure in which one or two or more layers having different components are laminated on the layer formed of the flame-retardant resin film above. As such a multi-layer structure, a structure containing a layer formed of the flame-retardant resin film above and a gas barrier layer is preferable, and the structure further containing a light stable layer is more preferable.

Typically, the solar battery back sheet is exposed to outdoors for a long period of time when the solar battery back sheet is used as the solar battery module forming material. For this reason, high water resistance against rain and frost is required. Particularly, gas barrier properties such as steam barrier properties are required of the solar battery back sheet. Accordingly, to shield steam, the solar battery back sheet according to the present embodiment preferably has a layer formed of the flame-retardant resin film above as a base material and a gas barrier layer. More specifically, the structure in which the gas barrier layer is laminated on the layer formed of the flame-retardant resin film above can improve the gas barrier properties of the solar battery back sheet. The gas barrier layer may not always be directly laminated on the layer formed of the resin composition above, and for example, may be laminated on the layer formed of the flame-retardant resin film with another layer interposed therebetween.

The gas barrier layer is not particularly limited, and for example, inorganic oxide deposition thin film layers and the like widely used for the solar battery back sheet as the gas barrier layer are used. Specifically, examples thereof include aluminum oxide deposition layers and silicon oxide deposition layers.

Further, the solar battery back sheet is partially exposed to the sunlight when the solar battery back sheet is used as the solar battery module forming material. For this reason, high light stability may be also required of the solar battery back sheet. From such a viewpoint, the solar battery back sheet according to the present embodiment preferably contains the layer formed of the flame-retardant resin film as the base material, and a light stable layer. More specifically, the structure further containing the light stable layer laminated on the layer formed of the flame-retardant resin film can improve the light stability of the solar battery back sheet. The light stable layer may not always be directly laminated on the layer formed of the flame-retardant resin film, and for example, may be laminated on the gas barrier layer laminated on the layer formed of the flame-retardant resin film.

The light stable layer is not particularly limited, and examples thereof include light stable coatings and fluorinated resin films widely used as the light stable layer for the solar battery back sheet.

It is not always presumed that the sunlight passes through the solar battery back sheet, and therefore the light transmittive properties required of the light transmittive substrate described later are not always needed. Then, a reinforcing plate may be further laminated in the solar battery back sheet according to the present embodiment to improve mechanical strength when the solar battery back sheet is used as the solar battery module forming material and to prevent distortion and warpage due to change in the temperature. As the reinforcing plate, for example, steel sheets, plastic plates, FRP (glass fiber-reinforced plastic) plates, and the like can be preferably used.

<Method for Producing Solar Battery Back Sheet>

In the case where the solar battery back sheet according to the present embodiment is composed of a single layer formed of the flame-retardant resin film above only, the solar battery back sheet can be obtained by using the flame-retardant resin composition as the raw material and performing extrusion film molding, or can be obtained by directly charging the raw material components that form the flame-retardant resin film above into an extrusion film molding machine, and performing blending and film molding at the same time.

Moreover, the solar battery back sheet according to the present embodiment may be produced, for example, by laminating layers in the case where another layer is laminated on the layer formed of the flame-retardant resin film.

<<Solar Battery Module>>

The solar battery module according to the present embodiment contains a light transmittive substrate, a sealing material layer, a solar battery element, and the solar battery back sheet above.

Preferably, in the solar battery module according to the present embodiment, the light transmittive substrate, at least one sealing material layer, the solar battery element, and the solar battery back sheet above are laminated at least in this order. The solar battery back sheet above has low heat-shrinkage and high hydrolysis resistance in addition to high electrical insulation properties. For this reason, sufficient durability and weatherability can be given to the solar battery module according to the present embodiment using the solar battery back sheet. The solar battery module according to the present embodiment may have a structure in which the solar battery element is sandwiched between two sealing material layers. For example, the sealing material layer may be a single layer, or may be a plurality of layers. Further, the solar battery module according to the present embodiment may have a structure in which the light transmittive substrate, a first sealing material layer, the solar battery element, a second sealing material layer, and the solar battery back sheet above are laminated in this order.

To effectively utilizing the sunlight, the light transmittive substrate is preferably a substrate having small optical loss and high transparency. When the solar battery module is produced, the light transmittive substrate is located in the outermost layer. For this reason, the light transmittive substrate preferably has performance for attaining long-term reliability of the solar battery module in exposure to outdoors such as weatherability, water repellency, resistance to pollution, and mechanical strength.

Examples of the material for the light transmittive substrate include resin substrates formed of polyester resins, fluorinated resins, acrylic resins, cyclic olefin (co)polymers, ethylene-vinyl acetate copolymers, and the like; and glass substrates. Among these, glass substrates are preferable from the viewpoint of the balance between weatherability, impact resistance, and cost.

Fluorinated resins having particularly high weatherability are also used suitably. Specifically, examples thereof include ethylene-tetrafluoroethylene copolymers (ETFE), polymonofluoroethylene (PVF), polydifluoroethylene (PVDF), polytrifluoroethylene, polytetrafluoroethylene (PTFE), tetrafluoroethylene-hexafluoropropylene copolymers (FEP), and polychlorotrifluoroethylene resins (CTFE). To improve adhesiveness between the light transmittive substrate and the material that forms another layer such as the sealing material layer described later, the light transmittive substrate is preferably subjected to a corona treatment or a plasma treatment. To improve mechanical strength, a stretched sheet such as a biaxially stretched polypropylene film can be used.

In the case where the glass substrate is used as the light transmittive substrate, white plate glass that does not absorb the infrared portion much is typically used. A thin blue plate glass has a small influence over output properties even when the float glass is used for the solar battery module. To enhance the mechanical strength of the glass substrate, reinforced glass can be obtained by a heat treatment. Non-heat treated float glass may be used. To prevent reflection on the light receiving surface of the glass substrate, an anti-reflective coating may be applied to the light receiving surface.

The material that forms the sealing material layer is not particularly limited, and known sealing materials can be used. Examples thereof include ethylene-vinyl acetate copolymers (EVA), ethylene-aliphatic unsaturated carboxylic acid copolymers, ethylene-aliphatic carboxylic acid ester copolymers, and sealing materials containing saponified products thereof. In the case where the first sealing material layer and the second sealing material layer are used, the first sealing material layer and the second sealing material layer may be formed of the same material or different materials.

The solar battery element is not particularly limited as long as the solar battery element can utilize the photovoltaic effect of the semiconductor and generate electricity. For example, silicon (single-crystalline, polycrystalline, and non-crystalline (amorphous)) semiconductors, compound semiconductors (Groups 3 to 5, Groups 2 to 6, and others), and the like can be used. Among these, polycrystalline silicon is preferable from the viewpoint of the balance between electricity generation performance and cost.

In the present embodiment, the method for producing the solar battery module is not particularly limited. Examples thereof can include a method in which the light transmittive substrate, the first sealing material layer, the solar battery element, the second sealing material layer, and the solar battery back sheet are layered in order and vacuum laminated into a module.

The flame-retardant resin film contained in the solar battery back sheet above has high bonding strength to ethylene-vinyl acetate copolymers (EVA) and the like typically used as the sealing material. For this reason, use of a special adhesive is eliminated in the vacuum lamination step in production of the solar battery module, leading to advantages in cost and production efficiency.

EXAMPLES

The present invention will be described more in detail according to Examples, but will not be limited by these Examples.

Polyphenylene Ether Resin (a)

a1: polyphenylene ether (hereinafter, also written as "PPE") obtained by oxidation polymerizing 2,6-xylenol. The PPE had a reduced viscosity (0.5 g/dl, chloroform solution, measured at 30° C.) of 0.50, and a glass transition temperature (Tg) measured at the DSC method of 215° C.

a2: PPE obtained by oxidation polymerizing 2,6-xylenol. The PPE had a reduced viscosity (0.5 g/dl, chloroform solution, measured at 30° C.) of 0.40, and a glass transition temperature (Tg) measured at the DSC method of 215° C.

a3: PPE obtained by oxidation polymerizing 2,6-xylenol. The PPE had a reduced viscosity of 0.35 and a glass transition temperature (Tg) measured at the DSC method of 213° C.

a4: atactic polystyrene (made by PS Japan Corporation, trade name polystyrene 685).

a5: high impact polystyrene (made by PS Japan Corporation, trade name polystyrene H9405).

Phosphorus Flame Retardant (b)

b1: condensed phosphate ester mainly containing bisdiphenyl phosphate of bisphenol A as the main component (made by DAIHACHI CHEMICAL INDUSTRY CO., LTD., trade name CR-741).

Fluorine-Containing Resin (c)

c1: polytetrafluoroethylene (made by DAIKIN INDUSTRIES, LTD., trade name polyfron (registered trademark) FA-500).

c2: a polytetrafluoroethylene masterbatch obtained by melt kneading polytetrafluoroethylene (made by DAIKIN INDUSTRIES, LTD., trade name polyfron (registered trademark) FA-500)/high impact polystyrene (made by PS Japan Corporation, polystyrene H9405) at 90% by mass/10% by mass in advance using a kneader.

c3: a tetrafluoroethylene-hexafluoropropylene copolymer (made by DAIKIN INDUSTRIES, LTD., trade name Neofron (registered trademark) FEP NP-101).

c4: an ethylene-tetrafluoroethylene copolymer (made by ASAHI GLASS CO., LTD., trade name Fluon (registered trademark) LM-720AP).

c5: an ethylene-tetrafluoroethylene copolymer (made by ASAHI GLASS CO., LTD., trade name Fluon (registered trademark) LM-730 AP).

c6: an ethylene-tetrafluoroethylene copolymer (made by ASAHI GLASS CO., LTD., trade name Fluon (registered trademark) LM-740 AP).

c7: an ethylene-tetrafluoroethylene copolymer (made by DAIKIN INDUSTRIES, LTD., trade name Neofron (registered trademark) ETFE EP-546).

c8: an ethylene-tetrafluoroethylene copolymer (made by DAIKIN INDUSTRIES, LTD., trade name Neofron (registered trademark) ETFE EP-610).

c9: an ethylene-tetrafluoroethylene-hexafluoropropylene copolymer (made by DAIKIN INDUSTRIES, LTD., trade name Neofron (registered trademark) EFEP RP-5000).

The melt flow rates (MFR) of the ethylene-tetrafluoroethylene copolymers and ethylene-tetrafluoroethylene-hexafluoropropylene copolymers were measured according to ASTM-D3159. The specific gravities of the ethylene-tetrafluoroethylene copolymers and ethylene-tetrafluoroethylene-hexafluoropropylene copolymers were measured according to ISO-1183. These measurement results are shown in Tables 1 to 8.

Hydrogenated Block Copolymer (d)

d1: a hydrogenated block copolymer having a block structure of polystyrene-hydrogenated polybutadiene-polystyrene, and having an amount of bounded styrene of 35%, a number average molecular weight of 197000, and a hydrogenation rate in the polybutadiene portion of 99.3%.

d2: a hydrogenated block copolymer having a block structure of polystyrene-hydrogenated polybutadiene-polystyrene, and having an amount of bounded styrene of 65%, a number average molecular weight of 85000, and a hydrogenation rate in the polybutadiene portion of 99.2%.

d3: a hydrogenated block copolymer having a block structure of polystyrene-hydrogenated polybutadiene-polystyrene, and having an amount of bounded styrene of 30%, a number average molecular weight of 61000, and a hydrogenation rate in the polybutadiene portion of 99.4%.

Examples 1 to 63 and Comparative Examples 1 to 16

Resin compositions were produced and the physical properties thereof were evaluated according to the following methods. Films were produced and the properties thereof were evaluated according to the following methods.

<Production of Resin Compositions and Evaluation of Physical Properties>

The resin composition was produced using a twin screw extruder ZSK-40 (made by WERNER & PFLEIDERER GmbH & Co. KG). In the twin screw extruder, a first raw material feeding port was provided upstream of the flow direction of the raw material. A second raw material feeding port and a third raw material feeding port were provided downstream of the first raw material feeding port, and vacuum vents were provided downstream of the second raw material feeding port and the third raw material feeding port. The method of feeding the raw material to the second raw material feeding port was a method of feeding a raw material from a side opening port in the extruder using a forcing side feeder. The method of feeding a raw material to the third raw material feeding port was a method of feeding a raw material from an upper opening port in the extruder using a gear pump. Further, a venting exhaust pipe was provided in the upper portion of the space of a hopper in which the raw material dropped from the gravimetric feeder in the extruder. Furthermore, nitrogen gas was fed to the raw material feed line. The concentration of oxygen was measured with oxygen meters (made by New Cosmos Electric Co., Ltd., digital oxygen meter XO-326ALA) installed in these passages to control the concentration of oxygen in the raw material feeding ports to be less than 1.0% by volume. In Example 40, the concentration of oxygen in the first raw material feeding port was controlled to be 1.4% by volume. In Example 49, the concentration of oxygen in the first raw material feeding port was controlled to be 1.6% by volume, and the concentration of oxygen in the second raw material feeding port was controlled to be 2.0% by volume. A wire mesh, #120 mesh (plain weave, mesh opening of 0.132 mm) was provided in a die portion of the extruder.

Using the extruder thus set, the raw material components such as the polyphenylene ether resin (a), the phosphorus flame retardant (b), the fluorine-containing resin (c), and the hydrogenated block copolymer (d) were introduced into the respective raw material feeding ports in the corresponding composition shown in Tables 1 to 8, and melt kneaded on the condition of an extrusion temperature of 300 to 320° C., the number of rotation of the screw of 300 rpm, an ejection amount of 80 kg/hr to obtain a resin composition as a pellet. The physical properties and the like of the resin compositions were evaluated according to the following methods (1) to (6). The results of evaluations are shown in Tables 9 to 16.

<Production of Films and Evaluation of Properties>

Using the pellet of the resin composition obtained, a film was produced as follows. The film was produced using a single screw extruder with a vent having a screw diameter of 65 mm in which the cylinder temperature was set at 270 to 340° C. Similarly to the case of the twin screw extruder used in production of the resin composition, nitrogen gas was fed to the raw material feed line in the single screw extruder to control the concentration of oxygen in the raw material feeding port to be less than 1.0% by volume. In Example 41, the concentration of oxygen in the raw material feeding port was 1.8% by volume. A specific production condition was an ejection amount of 60 kg/hr, the thickness of the T die slit of 0.50 mm, the width of the die slit of 650 mm, and a rolling roll surface temperature of 100 to 150° C. Under the production condition, a take up rate was adjusted to produce a film having a thickness of 20 to 500 μm.

The properties of the obtained films were evaluated according to the following methods (7) to (15). The results of evaluations are also shown in Tables 9 to 16.

<Method for Evaluating Physical Properties of Resin Composition and Method for Evaluating Properties of Film>

(1) Clogging of Extruder Wire Mesh (Productivity and Yield)

Every time when production of the pellet of the resin composition was completed (every 3 hours of operation), the die portion of the extruder was opened, and the wire mesh, #120 mesh (plain weave, mesh opening of 0.132 mm) was extracted. In the extracted wire mesh, the state of foreign substances adhering to the surface of the wire mesh through which the resin composition passed was observed, and clogging of the wire mesh in the extruder was evaluated on the following criterion:

(Criterion)

A: if fibril or gelated foreign substances adhere to 0% or more and 10% or less of the openings of the wire mesh.

B: if fibril or gelated foreign substances adhere to more than 10% and 50% or less of the openings of the wire mesh.

C: if fibril or gelated foreign substances adhere to more than 50% of the openings of the wire mesh.

(2) Measurement of Foreign Substances in Pellet

The foreign substances in the obtained pellet of the resin composition were measured by the following dissolution method and press method.

Dissolution method: 1 g of the pellet of the resin composition was dissolved in 20 ml of chloroform in a sample tube (50 ml) to obtain a solution. The solution was shaken with a shaker for 60 minutes. The solution after shaking was vacuum filtered with a filter paper having a diameter of 70 mm (made by ADVANTEC Co., LTD., quantitative filter paper No. 3). The filter paper after suction filtration was dried with air for 1 hour at room temperature, and the number of foreign substances left on the filter paper and having the largest diameter of 10 μm or more was counted. At this time, it was considered "unmeasurable" if the chloroform insoluble content (gelated substances) was large and could not be filtered with the filter paper.

Press method: 1 g of the pellet of the resin composition was placed in a metal mold having a thickness of 1 mm, and pressed for 3 minutes with a heat press set at 320° C. to obtain a flat plate. The front and rear surfaces of the flat plate were visually observed, and the number of foreign substances was measured.

(3) Measurement of Content of Fluorine Element

According to the method JPCA-ES01-2003, the content of the fluorine element in the obtained pellet of the resin composition was measured.

(4) Flame Retardancy

The obtained pellet of the resin composition was fed to a screw in-line type injection molding machine set at 220 to 320° C., and molded on the condition of a metal mold temperature 60 to 90° C. to produce a test piece having a thickness of 1.6 mm for measurement flame retardancy. According to the UL-94 5th Ed., the VB test was performed using the produced test piece having a thickness of 1.6 mm for measurement flame retardancy.

(5) Charpy Impact Strength

The obtained pellet of the resin composition was molded into a JIS K7139 test piece according to JIS K7152-1 and K7313-2, and machined to produce a test piece for measuring Charpy impact strength. Using the test piece for measuring Charpy impact strength, Charpy impact strength was measured according to JIS K7111-1.

(6) Weld Surface Appearance

The obtained pellet of the resin composition was formed into a weld test piece with a JIS K7139 test piece metal mold having runners at both ends. The weld surface appearance of the weld test piece using the resin composition (Example 37) to which a polytetrafluoroethylene masterbatch was added was set as the criterion (B), and the weld surface appearances of the weld test pieces were evaluated as follows.

(Criterion)

A: if the boundary of the weld portion is less prominent than that in Example 37.

B: if the boundary of the weld portion is equal to that in Example 37.

C: if the boundary of the weld portion is more prominent than that in Example 37.

(7) Measurement of Insoluble Fraction

Approximately 1 g (W1) of the obtained film was dissolved in 20 ml of chloroform in a precipitation tube (50 ml) to obtain a solution. The solution was shaken with a shaker for 60 minutes. The solution after shaking was centrifuged with a centrifuge, and further decanted to extract a precipitate. The precipitate was treated at 160° C. and normal pressure for 1 hour and further 2 hours under vacuum to remove the solvent from the precipitate. The weight (g) (W2) of the residue left by removing the solvent from the precipitate was measured. The insoluble fraction was calculated as follows:

$$\text{insoluble fraction (\%)} = (W2/W1) \times 100$$

(8) Measurement of the Number of Foreign Substances 1 g of the obtained film was dissolved in 20 ml of chloroform in a sample tube (50 ml) to obtain a solution. The solution was shaken with a shaker for 60 minutes. The solution after shaking was vacuum filtered with a filter paper having a diameter of 70 mm (made by ADVANTEC Co., LTD., quantitative filter paper No. 3). The filter paper after suction filtration was dried with air for 1 hour at room temperature, and the number of foreign substances left on the filter paper and having the largest diameter of 10 μm or more was measured. At this time, it was considered "unmeasurable" if the chloroform insoluble content (gelated substances) was large and could not be filtered with the filter paper.

(9) Flame Retardancy Test

According to the UL-94 5th Ed., the VTM test was performed using the obtained films. Among the obtained films, the film having a thickness of 400 μm or more was difficult to produce a test piece (to roll a sheet). For this reason, the film was subjected to the VB test. Depending on cases, a film having a thickness of 60 μm was produced using the resin composition having the same composition as that used for production of the film having a thickness of 400 μm or more, and the obtained film was subjected to the VTM test.

(10) Measurement of Glass Transition Temperature

The glass transition temperature of the resin composition component in the obtained films was measured with a DSC measurement machine made by Perkin-Elmer Inc. In the measurement, the temperature range was 50° C. to 300° C., the atmosphere was a nitrogen atmosphere, and the temperature raising rate was 20° C./min.

(11) Measurement of Heat Shrinkage Rate

The obtained films were cut into a size of 100 mm×100 mm to produce test pieces. The dimension in the MD of each of the test pieces was measured by a micro meter. Next, according to JIS-C2318, the test piece was left in a 150° C. hot oven for 30 minutes to be heat shrunk, and left for 24 hours in a laboratory controlled to have 23° C. and 50% RH. Subsequently, the dimension in the MD of each of the test pieces was again measured with the micro meter. The change in the dimension in the MD of the test piece before and after heat shrinking (shrinkage rate) was calculated. At this time, it was considered "unmeasurable" if the film greatly deformed and the dimension thereof could not be measured accurately.

(12) Measurement of Thickness Precision

Both ends of the obtained film having a predetermined thickness were cut off to produce a film of a width of 300 mm×a length of 500 mm. The thicknesses at the four corners of the film and places 20 mm toward the film center from between every adjacent corners were measured with a microgauge (made by Mitutoyo Corporation, Digimatic Indicator ID-C112BS) (8 places in total), and the standard deviation of the film thickness was calculated. A smaller standard deviation was considered higher thickness precision.

(13) Surface Appearance (Die Drop, Die Line)

In the production of the film, the T die lip was wiped, and the film was taken up for 3 hours. Then, die drop adhering to the lip was observed, and the surface appearance (die drop, die line) was evaluated on the following criterion.

(Criterion)

A: if no die drops occur.

B: if die lines are hardly found in the film but die drops occur.

C: if many die drops occur and die lines are found remarkably in the film.

(14) Surface Appearance (Gloss)

In the obtained film, by the method according to JIS-Z8741, the gloss level of the incident light and reflected light changeable angle of 60° was measured using a digital variable angle gloss meter (made by Nippon Denshoku Industries Co., Ltd.: VGS-1D type). Based on the measured value, the surface appearance (gloss) of the film was evaluated according to the following criterion.

(Criterion)

AA: if the gloss level is 95% or more.

A: if the gloss level is 70% or more and less than 95%.

B: if the gloss level is 60% or more and less than 70%.

C: if the gloss level is less than 60%.

(15) Back Sheet Processability

A transparent glass plate having a thickness of 5 mm, an ethylene-vinyl acetate copolymer having a thickness of 500 μm (made by ETIMEX Primary Packaging GmbH, VISTRASOLAR) as the sealing material, and the obtained film were formed into a size of a length of 100 mm and a width of 50 mm, and laminated in this order. The lamination was heat pressed at 150° C. for 30 minutes under reduced pressure to evaluate back sheet processability according to the following criterion.

(Criterion)

A: if no void is found between the film and the sealing material, and the film is closely bonded to the sealing material.

B: if voids are found between the film and the sealing material.

C: if the film is molten and deformed.

TABLE 1

| | | | Example 1 | Example 2 | Example 3 | Example 4 | Example 5 | Example 6 | Example 7 | Example 8 | Example 9 | Example 10 |
|---|---|---|---|---|---|---|---|---|---|---|---|---|
| First raw material feeding port | Component (a) (a1) | Parts by mass | 85 | 85 | 85 | 85 | 85 | 90 | 90 | 90 | 90 | 90 |
| | Component (a) (a2) | Parts by mass | | | | | | | | | | |
| | Component (a) (a3) | Parts by mass | | | | | | | | | | |
| | Component (a) (a4) | Parts by mass | | | | | | | | | | |
| | Component (a) (a5) | Parts by mass | | | | | | | | | | |
| | Component (b) (b1) | Parts by mass | | | | | | 10 | 10 | 10 | 10 | 10 |
| | Component (c) (c1) | Parts by mass | | | | | | 0.03 | 0.03 | 0.03 | 0.03 | 0.03 |
| | Component (c) (c2) | Parts by mass | | | | | | | | | | |
| | Component (c) (c3) | Parts by mass | | | | | | | | | | |
| | Component (c) (c4) | Parts by mass | | | | | | | | | | |
| | Component (c) (c5) | Parts by mass | 0.06 | 0.06 | 0.06 | 0.06 | 0.06 | | | | | |
| | Component (c) (c6) | Parts by mass | | | | | | | | | | |
| | Component (c) (c7) | Parts by mass | | | | | | | | | | |
| | Component (c) (c8) | Parts by mass | | | | | | | | | | |
| | Component (c) (c9) | Parts by mass | | | | | | | | | | |
| | Component (d) (d1) | Parts by mass | | | | | | | | | | |
| | Component (d) (d2) | Parts by mass | | | | | | | | | | |
| | Component (d) (d3) | Parts by mass | | | | | | | | | | |
| Second raw material feeding port | Component (a) (a4) | Parts by mass | | | | | | | | | | |
| | Component (c) (c1) | Parts by mass | | | | | | | | | | |
| | Component (c) (c5) | Parts by mass | | | | | | | | | | |
| | Component (d) (d1) | Parts by mass | | | | | | | | | | |
| Third raw material feeding port | Component (b) (b1) | Parts by mass | 15 | 15 | 15 | 15 | 15 | | | | | |
| Concentration of oxygen in raw material feeding port | First raw material feeding port | % by volume | 0.9 | 0.9 | 0.9 | 0.9 | 0.9 | | | | | |
| | Second raw material feeding port | % by volume | — | — | — | — | — | | | | | |
| MFR of component (c) used | | g/10 min | 25 | 25 | 25 | 25 | 25 | — | — | — | — | — |
| Specific gravity of component (c) used | | — | 1.76 | 1.76 | 1.76 | 1.76 | 1.76 | — | — | — | — | — |

TABLE 2

| | | | Example 11 | Example 12 | Example 13 | Example 14 | Example 15 | Example 16 | Example 17 | Example 18 | Example 19 | Example 20 | Example 21 | Example 22 | Example 23 | Example 24 |
|---|---|---|---|---|---|---|---|---|---|---|---|---|---|---|---|---|
| First raw material feeding port | Component (a) (a1) | Parts by mass | | 80 | 80 | 85 | 85 | 85 | 85 | 85 | 85 | 85 | 90 | 75 | 95 | 90 |
| | Component (a) (a2) | Parts by mass | | | | | | | | | | | | | | |
| | Component (a) (a3) | Parts by mass | 85 | | | | | | | | | | | | | |
| | Component (a) (a4) | Parts by mass | | | 5 | | | | | | | | | | | |
| | Component (a) (a5) | Parts by mass | | | | 5 | | | | | | | | | | |
| | Component (b) (b1) | Parts by mass | | | | | | | | | | | 10 | 25 | 5 | 10 |
| | Component (c) (c1) | Parts by mass | | | | 0.03 | | | | | | | | 0.03 | 0.03 | 0.03 |
| | Component (c) (c2) | Parts by mass | | | | | | | | | | | | | | |
| | Component (c) (c3) | Parts by mass | | | | | 0.03 | | | | | | | | | |
| | Component (c) (c4) | Parts by mass | | | | | | 0.06 | | | | | | | | |
| | Component (c) (c5) | Parts by mass | 0.06 | 0.06 | 0.06 | | | | | | | | 0.03 | | | |
| | Component (c) (c6) | Parts by mass | | | | | | | 0.06 | | | | | | | |
| | Component (c) (c7) | Parts by mass | | | | | | | | 0.06 | | | | | | |
| | Component (c) (c8) | Parts by mass | | | | | | | | | 0.06 | | | | | |
| | Component (c) (c9) | Parts by mass | | | | | | | | | | 0.06 | | | | |
| | Component (d) (d1) | Parts by mass | 5 | 5 | 5 | 5 | 5 | 5 | 5 | 5 | 5 | 5 | 5 | 5 | 5 | 0 |
| | Component (d) (d2) | Parts by mass | | | | | | | | | | | | | | |
| | Component (d) (d3) | Parts by mass | | | | | | | | | | | | | | |
| Second raw material feeding port | Component (a) (a4) | Parts by mass | | | | | | | | | | | | | | |
| | Component (c) (c1) | Parts by mass | | | | | | | | | | | | | | |
| | Component (c) (c5) | Parts by mass | | | | | | | | | | | | | | |
| | Component (d) (d1) | Parts by mass | | | | | | | | | | | | | | |
| Third raw material feeding port | Component (b) (b1) | Parts by mass | 15 | 15 | 15 | 15 | 15 | 15 | 15 | 15 | 15 | 15 | | | | |
| Concentration of oxygen in raw material feeding port | First raw material feeding port | % by volume | 0.5 | 0.6 | 0.8 | 0.6 | 0.5 | 0.6 | 0.6 | 0.7 | 0.8 | 0.4 | | | | |
| | Second raw material feeding port | % by volume | — | — | — | — | — | — | — | — | — | — | | | | |
| MFR of component (c) used | | g/10 min | 25 | 25 | 25 | — | — | 16 | 34 | 6 | 31 | 25 | 25 | — | — | — |
| Specific gravity of component (c) used | | — | 1.76 | 1.76 | 1.76 | — | — | 1.77 | 1.77 | 1.77 | 1.86 | 1.75 | 1.76 | — | — | — |

TABLE 3

| | | | Example 25 | Comparative Example 1 | Example 26 | Comparative Example 2 | Example 27 | Comparative Example 3 | Example 28 | Comparative Example 4 |
|---|---|---|---|---|---|---|---|---|---|---|
| First raw material feeding port | Component (a) (a1) | Parts by mass | 98 | 99 | 75 | 70 | 85 | 85 | 85 | 85 |
| | Component (a) (a2) | Parts by mass | | | | | | | | |
| | Component (a) (a3) | Parts by mass | | | | | | | | |
| | Component (a) (a4) | Parts by mass | | | | | | | | |
| | Component (a) (a5) | Parts by mass | | | | | | | | |
| | Component (b) (b1) | Parts by mass | | | | | | | | |
| | Component (c) (c1) | Parts by mass | | | | | | | | |
| | Component (c) (c2) | Parts by mass | | | | | | | | |
| | Component (c) (c3) | Parts by mass | | | | | | | | |
| | Component (c) (c4) | Parts by mass | | | | | | | | |
| | Component (c) (c5) | Parts by mass | 0.06 | 0.06 | 0.06 | 0.06 | 0.24 | 0.27 | 0.03 | 0.02 |
| | Component (c) (c6) | Parts by mass | | | | | | | | |
| | Component (c) (c7) | Parts by mass | | | | | | | | |
| | Component (c) (c8) | Parts by mass | | | | | | | | |
| | Component (c) (c9) | Parts by mass | | | | | | | | |
| | Component (d) (d1) | Parts by mass | 5 | 5 | 5 | 5 | 5 | 5 | 5 | 5 |
| | Component (d) (d2) | Parts by mass | | | | | | | | |
| | Component (d) (d3) | Parts by mass | | | | | | | | |
| Second raw material feeding port | Component (a) (a4) | Parts by mass | | | | | | | | |
| | Component (c) (c1) | Parts by mass | | | | | | | | |
| | Component (c) (c5) | Parts by mass | | | | | | | | |
| | Component (d) (d1) | Parts by mass | | | | | | | | |
| Third raw material feeding port | Component (b) (b1) | Parts by mass | 2 | 1 | 25 | 30 | 15 | 15 | 15 | 15 |

TABLE 3-continued

|  |  |  | Example 25 | Comparative Example 1 | Example 26 | Comparative Example 2 | Example 27 | Comparative Example 3 | Example 28 | Comparative Example 4 |
|---|---|---|---|---|---|---|---|---|---|---|
| Concentration of oxygen in raw material feeding port | First raw material feeding port | % by volume | 0.8 | 0.9 | 0.6 | 0.8 | 0.7 | 0.6 | 0.8 | 0.5 |
|  | Second raw material feeding port | % by volume | — | — | — | — | — | — | — | — |
| MFR of component (c) used |  | g/10 min | 25 | 25 | 25 | 25 | 25 | 25 | 25 | 25 |
| Specific gravity of component (c) used |  | — | 1.76 | 1.76 | 1.76 | 1.76 | 1.76 | 1.76 | 1.76 | 1.76 |

TABLE 4

|  |  |  | Example 29 | Example 30 | Example 31 | Example 32 | Example 33 | Example 34 | Example 35 | Example 36 |
|---|---|---|---|---|---|---|---|---|---|---|
| First raw material feeding port | Component (a) (a1) | Parts by mass | 86.4 | 86.4 |  |  | 86.4 | 86.4 | 86.4 | 75 |
|  | Component (a) (a2) | Parts by mass |  |  | 86.4 | 81.8 |  |  |  |  |
|  | Component (a) (a3) | Parts by mass |  |  |  |  |  |  |  |  |
|  | Component (a) (a4) | Parts by mass |  |  |  | 4.5 |  |  |  |  |
|  | Component (a) (a5) | Parts by mass |  |  |  |  |  |  |  |  |
|  | Component (b) (b1) | Parts by mass |  |  |  |  |  |  |  |  |
|  | Component (c) (c1) | Parts by mass | 0.023 |  |  |  | 0.023 | 0.073 | 0.036 | 0.025 |
|  | Component (c) (c2) | Parts by mass |  |  |  |  |  |  |  |  |
|  | Component (c) (c3) | Parts by mass |  |  |  |  |  |  |  |  |
|  | Component (c) (c4) | Parts by mass |  |  |  |  |  |  |  |  |
|  | Component (c) (c5) | Parts by mass |  | 0.045 |  |  |  |  |  |  |
|  | Component (c) (c6) | Parts by mass |  |  |  |  |  |  |  |  |
|  | Component (c) (c7) | Parts by mass |  |  |  |  |  |  |  |  |
|  | Component (c) (c8) | Parts by mass |  |  |  |  |  |  |  |  |
|  | Component (c) (c9) | Parts by mass |  |  |  |  |  |  |  |  |
|  | Component (d) (d1) | Parts by mass | 4.5 | 4.5 | 4.5 | 4.5 |  | 4.5 | 4.5 | 25 |
|  | Component (d) (d2) | Parts by mass |  |  |  |  | 2.7 |  |  |  |
|  | Component (d) (d3) | Parts by mass |  |  |  |  | 1.8 |  |  |  |
| Second raw material feeding port | Component (a) (a4) | Parts by mass |  |  |  |  |  |  |  |  |
|  | Component (c) (c1) | Parts by mass |  |  | 0.023 | 0.023 |  |  |  |  |
|  | Component (c) (c5) | Parts by mass |  |  |  |  |  |  |  |  |
|  | Component (d) (d1) | Parts by mass |  |  |  |  |  |  |  |  |
| Third raw material feeding port | Component (b) (b1) | Parts by mass | 13.6 | 13.6 | 13.6 | 13.6 | 13.6 | 13.6 | 13.6 | 25 |
| Concentration of oxygen in raw material feeding port | First raw material feeding port | % by volume | 0.5 | 0.6 | 0.6 | 0.5 | 0.6 | 0.6 | 0.7 | 0.3 |
|  | Second raw material feeding port | % by volume | 0.6 | 0.6 | 0.4 | 0.5 | 0.6 | 0.5 | 0.5 | 0.6 |
| MFR of component (c) used |  | g/10 min | — | 25 | — | — | — | — | — | — |
| Specific gravity of component (c) used |  | — | — | 1.76 | — | — | — | — | — | — |

TABLE 5

|  |  |  | Comparative Example 5 | Comparative Example 6 | Comparative Example 7 | Comparative Example 8 | Comparative Example 9 | Comparative Example 10 | Comparative Example 11 |
|---|---|---|---|---|---|---|---|---|---|
| First raw material feeding port | Component (a) (a1) | Parts by mass | 90 | 70 | 100 | 90 | 86.4 | 86.4 | 68.2 |
|  | Component (a) (a2) | Parts by mass |  |  |  |  |  |  |  |
|  | Component (a) (a3) | Parts by mass |  |  |  |  |  |  |  |
|  | Component (a) (a4) | Parts by mass |  |  |  |  |  |  |  |
|  | Component (a) (a5) | Parts by mass |  |  |  |  |  |  |  |
|  | Component (b) (b1) | Parts by mass | 10 | 30 | 0 | 10 |  |  |  |
|  | Component (c) (c1) | Parts by mass | 0 | 0.03 | 0.03 | 0.50 |  | 0.011 | 0.023 |
|  | Component (c) (c2) | Parts by mass |  |  |  |  |  |  |  |
|  | Component (c) (c3) | Parts by mass |  |  |  |  |  |  |  |

TABLE 5-continued

|  |  |  | Comparative Example 5 | Comparative Example 6 | Comparative Example 7 | Comparative Example 8 | Comparative Example 9 | Comparative Example 10 | Comparative Example 11 |
|---|---|---|---|---|---|---|---|---|---|
|  | Component (c) (c4) | Parts by mass |  |  |  |  |  |  |  |
|  | Component (c) (c5) | Parts by mass |  |  |  |  |  |  |  |
|  | Component (c) (c6) | Parts by mass |  |  |  |  |  |  |  |
|  | Component (c) (c7) | Parts by mass |  |  |  |  |  |  |  |
|  | Component (c) (c8) | Parts by mass |  |  |  |  |  |  |  |
|  | Component (c) (c9) | Parts by mass |  |  |  |  |  |  |  |
|  | Component (d) (d1) | Parts by mass | 5 | 5 | 5 | 5 | 4.5 | 4.5 | 22.7 |
|  | Component (d) (d2) | Parts by mass |  |  |  |  |  |  |  |
|  | Component (d) (d3) | Parts by mass |  |  |  |  |  |  |  |
| Second raw material feeding port | Component (a) (a4) | Parts by mass |  |  |  |  |  |  |  |
|  | Component (c) (c1) | Parts by mass |  |  |  |  |  |  |  |
|  | Component (c) (c5) | Parts by mass |  |  |  |  |  |  |  |
|  | Component (d) (d1) | Parts by mass |  |  |  |  |  |  |  |
| Third raw material feeding port | Component (b) (b1) | Parts by mass |  |  |  |  | 13.6 | 13.6 | 31.8 |
| Concentration of oxygen in raw material feeding port | First raw material feeding port | % by volume |  |  |  |  | 0.7 | 0.6 | 0.4 |
|  | Second raw material feeding port | % by volume |  |  |  |  | 0.7 | 0.7 | 0.6 |
|  | MFR of component (c) used | g/10 min | — | — | — | — | — | — | — |
|  | Specific gravity of component (c) used | — | — | — | — | — | — | — | — |

TABLE 6

|  |  |  | Example 37 | Example 38 | Example 39 | Example 40 | Example 41 | Example 42 | Example 43 |
|---|---|---|---|---|---|---|---|---|---|
| First raw material feeding port | Component (a) (a1) | Parts by mass | 85 | 85 | 85 | 85 | 85 | 85 | 40 |
|  | Component (a) (a2) | Parts by mass |  |  |  |  |  |  |  |
|  | Component (a) (a3) | Parts by mass |  |  |  |  |  |  |  |
|  | Component (a) (a4) | Parts by mass |  |  |  |  |  |  | 5 |
|  | Component (a) (a5) | Parts by mass |  |  |  |  |  |  |  |
|  | Component (b) (b1) | Parts by mass |  |  | 15 |  |  |  |  |
|  | Component (c) (c1) | Parts by mass |  |  |  |  |  |  |  |
|  | Component (c) (c2) | Parts by mass | 0.30 |  |  |  |  |  |  |
|  | Component (c) (c3) | Parts by mass |  |  |  |  |  |  |  |
|  | Component (c) (c4) | Parts by mass |  |  |  |  |  |  |  |
|  | Component (c) (c5) | Parts by mass |  | 0.06 | 0.06 | 0.06 | 0.06 | 0.06 | 0.06 |
|  | Component (c) (c6) | Parts by mass |  |  |  |  |  |  |  |
|  | Component (c) (c7) | Parts by mass |  |  |  |  |  |  |  |
|  | Component (c) (c8) | Parts by mass |  |  |  |  |  |  |  |
|  | Component (c) (c9) | Parts by mass |  |  |  |  |  |  |  |
|  | Component (d) (d1) | Parts by mass | 5 | 5 |  | 5 | 5 | 5 |  |
|  | Component (d) (d2) | Parts by mass |  |  |  |  |  |  |  |
|  | Component (d) (d3) | Parts by mass |  |  |  |  |  |  |  |
| Second raw material feeding port | Component (a) (a4) | Parts by mass |  |  |  |  |  |  | 30 |
|  | Component (c) (c1) | Parts by mass |  |  |  |  |  |  |  |
|  | Component (c) (c5) | Parts by mass |  |  |  |  |  |  |  |
|  | Component (d) (d1) | Parts by mass |  |  | 5 |  |  |  |  |
| Third raw material feeding port | Component (b) (b1) | Parts by mass | 15 |  | 15 | 15 | 15 | 15 | 25 |
| Concentration of oxygen in raw material feeding port | First raw material feeding port | % by volume | 0.6 | 0.6 | 0.7 | 1.4 | 0.9 | 0.8 | 0.8 |
|  | Second raw material feeding port | % by volume | — | — | 0.9 | — | — | — | 0.5 |
|  | MFR of component (c) used | g/10 min | — | 25 | 25 | 25 | 25 | 25 | 25 |
|  | Specific gravity of component (c) used | — | — | 1.76 | 1.76 | 1.76 | 1.76 | 1.76 | 1.76 |

|  |  |  | Example 44 | Example 45 | Example 46 | Example 47 | Example 48 | Example 49 |
|---|---|---|---|---|---|---|---|---|
| First raw material feeding port | Component (a) (a1) | Parts by mass | 40 | 76 | 86.4 | 86.4 | 86.4 | 86.4 |
|  | Component (a) (a2) | Parts by mass |  |  |  |  |  |  |
|  | Component (a) (a3) | Parts by mass |  |  |  |  |  |  |
|  | Component (a) (a4) | Parts by mass | 5 |  |  |  |  |  |
|  | Component (a) (a5) | Parts by mass |  |  |  |  |  |  |

TABLE 6-continued

|  |  |  |  |  |  |  |  |  |
|---|---|---|---|---|---|---|---|---|
|  | Component (b) (b1) | Parts by mass |  | 12 | 13.6 |  |  |  |
|  | Component (c) (c1) | Parts by mass |  |  | 0.020 | 0.020 |  | 0.020 |
|  | Component (c) (c2) | Parts by mass |  |  |  |  |  |  |
|  | Component (c) (c3) | Parts by mass |  |  |  |  |  |  |
|  | Component (c) (c4) | Parts by mass |  |  |  |  |  |  |
|  | Component (c) (c5) | Parts by mass | 0.06 | 0.128 |  |  |  |  |
|  | Component (c) (c6) | Parts by mass |  |  |  |  |  |  |
|  | Component (c) (c7) | Parts by mass |  |  |  |  |  |  |
|  | Component (c) (c8) | Parts by mass |  |  |  |  |  |  |
|  | Component (c) (c9) | Parts by mass |  |  |  |  |  |  |
|  | Component (d) (d1) | Parts by mass |  | 4 | 4 |  | 4 | 4 |
|  | Component (d) (d2) | Parts by mass |  |  |  |  |  |  |
|  | Component (d) (d3) | Parts by mass |  |  |  |  |  |  |
| Second raw material feeding port | Component (a) (a4) | Parts by mass | 30 |  |  |  |  |  |
|  | Component (c) (c1) | Parts by mass |  |  |  |  | 0.020 |  |
|  | Component (c) (c5) | Parts by mass |  |  |  |  |  |  |
|  | Component (d) (d1) | Parts by mass |  |  |  | 4 |  |  |
| Third raw material feeding port | Component (b) (b1) | Parts by mass | 25 | 12 |  | 13.6 | 13.6 | 13.6 |
| Concentration of oxygen in raw material feeding port | First raw material feeding port | % by volume | 0.8 | 0.4 | 0.5 | 0.6 | 0.6 | 1.6 |
|  | Second raw material feeding port | % by volume | 0.5 | 0.4 | 0.6 | 0.7 | 0.5 | 2.0 |
| MFR of component (c) used |  | g/10 min | 25 | — | — | — | — | — |
| Specific gravity of component (c) used |  | — | 1.76 | — | — | — | — | — |

TABLE 7

|  |  |  | Example 50 | Comparative Example 12 | Comparative Example 13 | Example 51 | Example 52 | Example 53 | Example 54 | Example 55 | Example 56 | Example 57 |
|---|---|---|---|---|---|---|---|---|---|---|---|---|
| First raw material feeding port | Component (a) (a1) | Parts by mass | 40 | 40 | 40 | 40 | 40 | 40 | 40 | 40 | 42.1 | 25 |
|  | Component (a) (a2) | Parts by mass |  |  |  |  |  |  |  |  |  |  |
|  | Component (a) (a3) | Parts by mass |  |  |  |  |  |  |  |  |  |  |
|  | Component (a) (a4) | Parts by mass | 5 | 5 | 5 |  |  |  |  |  |  |  |
|  | Component (a) (a5) | Parts by mass |  |  |  | 15 | 15 | 15 | 15 | 15 | 10.5 | 15 |
|  | Component (b) (b1) | Parts by mass |  |  |  |  |  |  |  |  |  |  |
|  | Component (c) (c1) | Parts by mass |  |  |  |  |  |  |  |  |  |  |
|  | Component (c) (c2) | Parts by mass |  |  |  |  |  |  |  |  |  |  |
|  | Component (c) (c3) | Parts by mass |  |  |  |  |  |  |  |  |  |  |
|  | Component (c) (c4) | Parts by mass |  |  |  |  | 0.06 |  |  |  |  |  |
|  | Component (c) (c5) | Parts by mass | 0.06 | 0.06 | 0.02 | 0.06 |  |  | 0.03 | 0.24 | 0.06 | 0.06 |
|  | Component (c) (c6) | Parts by mass |  |  |  |  |  | 0.06 |  |  |  |  |
|  | Component (c) (c7) | Parts by mass |  |  |  |  |  |  |  |  |  |  |
|  | Component (c) (c8) | Parts by mass |  |  |  |  |  |  |  |  |  |  |
|  | Component (c) (c9) | Parts by mass |  |  |  |  |  |  |  |  |  |  |
|  | Component (d) (d1) | Parts by mass |  |  |  |  |  |  |  | 5.3 |  |  |
|  | Component (d) (d2) | Parts by mass |  |  |  |  |  |  |  |  |  |  |
|  | Component (d) (d3) | Parts by mass |  |  |  |  |  |  |  |  |  |  |
| Second raw material feeding port | Component (a) (a4) | Parts by mass | 30 | 25 | 30 | 30 | 30 | 30 | 30 | 30 | 31.6 | 40 |
|  | Component (c) (c1) | Parts by mass |  |  |  |  |  |  |  |  |  |  |
|  | Component (c) (c5) | Parts by mass |  |  |  |  |  |  |  |  |  |  |
|  | Component (d) (d1) | Parts by mass |  |  |  |  |  |  |  |  |  |  |
| Third raw material feeding port | Component (b) (b1) | Parts by mass | 25 | 30 | 25 | 15 | 15 | 15 | 15 | 15 | 15.8 | 20 |
| Concentration of oxygen in raw material feeding port | First raw material feeding port | % by volume | 0.8 | 0.7 | 0.7 | 0.8 | 0.7 | 0.4 | 0.5 | 0.5 | 0.6 | 0.4 |
|  | Second raw material feeding port | % by volume | 0.5 | 0.6 | 0.8 | 0.6 | 0.6 | 0.6 | 0.5 | 0.5 | 0.6 | 0.8 |
| MFR of component (c) used |  | g/10 min | 25 | 25 | 25 | 16 | 25 | 34 | 25 | 25 | 25 | 25 |
| Specific gravity of component (c) used |  | — | 1.76 | 1.76 | 1.76 | 1.77 | 1.76 | 1.77 | 1.76 | 1.76 | 1.76 | 1.76 |

TABLE 8

|  |  |  | Example 58 | Example 59 | Example 60 | Example 61 | Example 62 | Example 63 | Comparative Example 14 | Comparative Example 15 | Comparative Example 16 |
|---|---|---|---|---|---|---|---|---|---|---|---|
| First raw material feeding port | Component (a) (a1) | Parts by mass | 40 | 40 | 40 | 40 | 40 | 40 | 40.2 | 40 | 40 |
|  | Component (a) (a2) | Parts by mass |  |  |  |  |  |  |  |  |  |
|  | Component (a) (a3) | Parts by mass |  |  |  |  |  |  |  |  |  |
|  | Component (a) (a4) | Parts by mass |  |  |  |  |  |  |  |  |  |
|  | Component (a) (a5) | Parts by mass | 15 | 45 | 45 | 15 | 15 |  | 15.1 | 15 | 15 |
|  | Component (b) (b1) | Parts by mass | 15 |  | 15 |  |  |  |  |  |  |
|  | Component (c) (c1) | Parts by mass |  |  |  |  |  |  |  |  |  |
|  | Component (c) (c2) | Parts by mass |  |  |  |  |  |  |  |  |  |
|  | Component (c) (c3) | Parts by mass |  |  |  |  |  |  |  |  |  |
|  | Component (c) (c4) | Parts by mass |  |  |  |  |  |  |  |  |  |
|  | Component (c) (c5) | Parts by mass |  |  | 0.06 | 0.06 |  |  |  | 0.02 | 0.27 |
|  | Component (c) (c6) | Parts by mass |  |  |  |  |  |  |  |  |  |
|  | Component (c) (c7) | Parts by mass |  |  |  |  | 0.06 |  |  |  |  |
|  | Component (c) (c8) | Parts by mass |  |  |  |  |  | 0.06 |  |  |  |
|  | Component (c) (c9) | Parts by mass |  |  |  |  |  |  |  |  |  |
|  | Component (d) (d1) | Parts by mass |  |  |  |  |  |  |  |  |  |
|  | Component (d) (d2) | Parts by mass |  |  |  |  |  |  | 0.6 |  |  |
|  | Component (d) (d3) | Parts by mass |  |  |  |  |  |  |  |  |  |
| Second raw material feeding port | Component (a) (a4) | Parts by mass | 30 |  |  | 45 | 30 | 30 | 29.6 | 30 | 30 |
|  | Component (c) (c1) | Parts by mass |  |  |  |  |  |  |  |  |  |
|  | Component (c) (c5) | Parts by mass | 0.06 |  |  | 0.06 |  |  |  |  |  |
|  | Component (d) (d1) | Parts by mass |  |  |  |  |  |  |  |  |  |
| Third raw material feeding port | Component (b) (b1) | Parts by mass |  | 15 |  | 15 | 15 | 15 | 15.1 | 15 | 15 |
| Concentration of oxygen in raw material feeding port | First raw material feeding port | % by volume | 0.8 | 0.9 | 0.9 | 0.8 | 0.9 | 0.8 | 0.6 | 0.7 | 0.7 |
|  | Second raw material feeding port | % by volume | 0.7 | — | — | 0.8 | 0.6 | 0.7 | 0.5 | 0.6 | 0.7 |
| MFR of component (c) used |  | g/10 min | 25 | 25 | 25 | 25 | 6 | 31 | — | 25 | 25 |
| Specific gravity of component (c) used |  | — | 1.76 | 1.76 | 1.76 | 1.76 | 1.77 | 1.86 | — | 1.76 | 1.76 |

TABLE 9

|  |  |  | Example 1 | Example 2 | Example 3 | Example 4 | Example 5 | Example 6 | Example 7 | Example 8 | Example 9 | Example 10 |
|---|---|---|---|---|---|---|---|---|---|---|---|---|
| Clogging of extruder wire mesh |  | — | A | A | A | A | A | B | B | B | B | B |
| Foreign substances in pellet of resin composition | Dissolution method | Number | 7 | 7 | 7 | 7 | 7 |  |  |  |  |  |
|  | Press method | Number | 6 | 6 | 6 | 6 | 6 |  |  |  |  |  |
| Content of fluorine element |  | Mass ppm | 228 | 228 | 228 | 228 | 228 | 216 | 216 | 216 | 216 | 216 |
| Physical properties (injection molding) | UL94 VB test | Rank | V-0 | V-0 | V-0 | V-0 | V-0 | V-0 | V-0 | V-0 | V-0 | V-0 |
|  | Number of drops |  | 0 | 0 | 0 | 0 | 0 | 0 | 0 | 0 | 0 | 0 |
|  | Charpy impact strength | kJ/m$^2$ | 22 | 22 | 22 | 22 | 22 | 25 | 25 | 25 | 25 | 25 |
|  | Weld surface appearance | — | A | A | A | A | A | B | B | B | B | B |
| Concentration of oxygen in raw material feeding port in film forming machine |  | % by volume | 0.6 | 0.6 | 0.6 | 0.6 | 0.6 |  |  |  |  |  |
| Film properties | Film thickness | μm | 150 | 25 | 50 | 250 | 430 | 20 | 50 | 100 | 150 | 250 |
|  | Thickness precision Average | μm | 151 | 25 | 51 | 251 | 430 |  |  |  |  |  |
|  | Max. | μm | 156 | 26 | 52 | 255 | 434 |  |  |  |  |  |
|  | Min. | μm | 145 | 24 | 49 | 245 | 426 |  |  |  |  |  |
|  | Standard deviation | — | 3.4 | 0.9 | 1.2 | 3.2 | 3.1 |  |  |  |  |  |
|  | Insoluble fraction | % | 0.4 | 0.4 | 0.4 | 0.4 | 0.4 | 0.4 | 0.4 | 0.4 | 0.3 | 0.4 |
|  | Foreign substances | Number | 12 | 18 | 14 | 12 | 10 |  |  |  |  |  |
|  | UL94 VTM (VB) test | Rank | VTM-0 | VTM-0 | VTM-0 | VTM-0 | (V-0) | VTM-0 | VTM-0 | VTM-0 | VTM-0 | VTM-0 |
|  | Glass transition temperature | °C. | 165 | 165 | 165 | 165 | 165 | 165 | 165 | 165 | 165 | 165 |
|  | Heat shrinkage rate MD | % | 0.4 | 0.4 | 0.4 | 0.3 | 0.3 | 0.3 | 0.3 | 0.4 | 0.5 | 0.5 |
|  | TD | % | 0.3 | 0.3 | 0.3 | 0.2 | 0.2 |  |  |  |  |  |
|  | Surface appearance (die drop, die line) | — | A | A | A | A | A |  |  |  |  |  |
|  | Surface appearance (gloss) | — | A | A | A | A | A |  |  |  |  |  |
|  | Back sheet processability | — | A | A | A | A | A |  |  |  |  |  |

TABLE 10

|  |  |  | Example 11 | Example 12 | Example 13 | Example 14 | Example 15 | Example 16 |
|---|---|---|---|---|---|---|---|---|
| Clogging of extruder wire mesh | | — | A | A | A | C | A | A |
| Foreign substances in pellet of resin composition | Dissolution method | Number | 8 | 6 | Unmeasurable | Unmeasurable | 8 | 3 |
| | Press method | Number | 8 | 6 | 8 | 7 | 7 | 4 |
| Content of fluorine element | | Mass ppm | 220 | 225 | 227 | 200 | 210 | 229 |
| Physical properties (injection molding) | UL94 VB test | Rank | V-0 | V-0 | V-0 | V-0 | V-0 | V-0 |
| | | Number of drops | 0 | 0 | 0 | 0 | 0 | 0 |
| | Charpy impact strength | kJ/m² | 19 | 21 | 23 | 21 | 22 | 23 |
| | Weld surface appearance | — | A | A | A | C | A | A |
| Concentration of oxygen in raw material feeding port in film forming machine | | % by volume | 0.4 | 0.5 | 0.5 | 0.7 | 0.6 | 0.6 |
| Film properties | Film thickness | μm | 150 | 150 | 150 | 150 | 150 | 150 |
| | Thickness precision  Average | μm | 149 | 151 | 152 | 152 | 151 | 151 |
| | Max. | μm | 154 | 160 | 162 | 166 | 160 | 156 |
| | Min. | μm | 146 | 147 | 141 | 135 | 147 | 146 |
| | Standard deviation | — | 3.6 | 4.1 | 8.7 | 8.3 | 4.1 | 3.3 |
| | Insoluble fraction | % | 0.4 | 0.3 | 1.3 | 0.5 | 0.3 | 0.3 |
| | Foreign substances | Number | 15 | 9 | Unmeasurable | Unmeasurable | 11 | 8 |
| | UL94 VTM (VB) test | Rank | VTM-0 | VTM-0 | VTM-1 | VTM-0 | VTM-0 | VTM-0 |
| | Glass transition temperature | °C. | 162 | 154 | 152 | 165 | 164 | 165 |
| | Heat shrinkage rate  MD | % | 0.4 | 0.6 | 0.7 | 0.8 | 0.4 | 0.5 |
| | TD | % | 0.3 | 0.4 | 0.6 | 0.3 | 0.3 | 0.3 |
| | Surface appearance (die drop, die line) | — | A | A | B | B | A | A |
| | Surface appearance (gloss) | — | AA | A | B | A | A | A |
| | Back sheet processability | — | A | B | B | B | A | A |

|  |  |  | Example 17 | Example 18 | Example 19 | Example 20 | Example 21 | Example 22 | Example 23 | Example 34 |
|---|---|---|---|---|---|---|---|---|---|---|
| Clogging of extruder wire mesh | | — | A | A | A | A | A | B | B | B |
| Foreign substances in pellet of resin composition | Dissolution method | Number | 4 | 6 | 7 | 8 | | | | |
| | Press method | Number | 3 | 4 | 5 | 6 | | | | |
| Content of fluorine element | | Mass ppm | 230 | 223 | 223 | 230 | 121 | 203 | 206 | 212 |
| Physical properties (injection molding) | UL94 VB test | Rank | V-0 | V-0 | V-0 | V-0 | V-0 | V-0 | V-0 | V-0 |
| | | Number of drops | 0 | 0 | 0 | 0 | 0 | 0 | 0 | 0 |
| | Charpy impact strength | kJ/m² | 22 | 18 | 17 | 22 | 24 | 20 | 26 | 11 |
| | Weld surface appearance | — | A | A | A | A | A | B | B | B |
| Concentration of oxygen in raw material feeding port in film forming machine | | % by volume | 0.5 | 0.6 | 0.6 | 0.6 | | | | |
| Film properties | Film thickness | μm | 150 | 150 | 150 | 150 | 50 | 50 | 50 | 50 |
| | Thickness precision  Average | μm | 149 | 151 | 151 | 150 | | | | |
| | Max. | μm | 156 | 157 | 157 | 158 | | | | |
| | Min. | μm | 146 | 146 | 146 | 145 | | | | |
| | Standard deviation | — | 3.6 | 3.4 | 3.4 | 3.8 | | | | |
| | Insoluble fraction | % | 0.4 | 0.4 | 0.4 | 0.4 | 0.4 | 0.4 | 0.4 | 0.4 |
| | Foreign substances | Number | 10 | 13 | 13 | 12 | | | | |
| | UL94 VTM (VB) test | Rank | VTM-0 | VTM-0 | VTM-0 | VTM-0 | VTM-0 | VTM-0 | VTM-0 | VTM-0 |
| | Glass transition temperature | °C. | 164 | 165 | 165 | 165 | 165 | 150 | 190 | 195 |
| | Heat shrinkage rate  MD | % | 0.5 | 0.4 | 0.4 | 0.5 | 0.3 | 0.5 | 0.1 | 0.1 |
| | TD | % | 0.3 | 0.2 | 0.2 | 0.2 | | | | |
| | Surface appearance (die drop, die line) | — | A | A | A | A | | | | |
| | Surface appearance (gloss) | — | A | A | A | A | | | | |
| | Back sheet processability | — | A | A | A | A | | | | |

TABLE 11

|  |  |  | Example 25 | Comparative Example 1 | Example 26 | Comparative Example 2 | Example 27 | Comparative Example 3 | Example 28 | Comparative Example 4 |
|---|---|---|---|---|---|---|---|---|---|---|
| Clogging of extruder wire mesh | | — | A | A | A | A | A | A | A | A |
| Foreign substances in pellet of resin composition | Dissolution method | Number | 9 | 16 | 8 | 8 | 6 | 9 | 8 | 9 |
| | Press method | Number | 8 | 17 | 7 | 8 | 7 | 8 | 8 | 8 |
| Content of fluorine element | | Mass ppm | 222 | 225 | 221 | 221 | 923 | 1063 | 113 | 83 |

TABLE 11-continued

|  |  |  | Example 25 | Comparative Example 1 | Example 26 | Comparative Example 2 | Example 27 | Comparative Example 3 | Example 28 | Comparative Example 4 |
|---|---|---|---|---|---|---|---|---|---|---|
| Physical properties (injection molding) | UL94 VB test | Rank | V-0 | V-1 | V-0 | V-0 | V-0 | V-1 | V-0 | V-1 |
|  |  | Number of drops | 0 | 0 | 0 | 0 | 0 | 0 | 0 | 2 |
|  | Charpy impact strength | kJ/m² | 24 | 22 | 16 | 18 | 23 | 20 | 23 | 22 |
|  | Weld surface appearance | — | — | A | A | A | A | A | B | A | A |
|  | Concentration of oxygen in raw material feeding port in film forming machine | % by volume | 0.8 | 0.7 | 0.5 | 0.8 | 0.6 | 0.8 | 0.7 | 0.5 |
| Film properties | Film thickness | μm | 150 | 150 | 150 | 150 | 150 | 150 | 150 | 150 |
|  | Thickness precision Average | μm | 151 | 150 | 152 | 151 | 150 | 151 | 150 | 152 |
|  | Max. | μm | 156 | 158 | 159 | 158 | 157 | 160 | 157 | 165 |
|  | Min. | μm | 146 | 143 | 144 | 145 | 146 | 138 | 145 | 140 |
|  | Standard deviation | — | 3.3 | 4.2 | 3.9 | 4.8 | 3.6 | 12.9 | 4.7 | 12.0 |
|  | Insoluble fraction | % | 0.3 | 0.4 | 0.3 | 0.6 | 0.4 | 0.5 | 0.3 | 0.3 |
|  | Foreign substances | Number | 13 | 23 | 10 | 14 | 12 | 14 | 14 | 11 |
|  | UL94 VTM (VB) test | Rank | VTM-0 | VTM-2 | VTM-0 | VTM-0 | VTM-0 | VTM-2 | VTM-0 | VTM-1 |
|  | Glass transition temperature | °C. | 203 | 205 | 142 | 135 | 164 | 166 | 165 | 166 |
|  | Heat shrinkage rate MD | % | 0.2 | 0.2 | 0.6 | 0.8 | 0.5 | 0.8 | 0.5 | 0.4 |
|  | TD | % | 0.1 | 0.1 | 0.4 | 0.6 | 0.3 | 0.3 | 0.3 | 0.3 |
|  | Surface appearance (die drop, die line) | — | A | C | B | A | A | A | A | A |
|  | Surface appearance (gloss) | — | A | A | A | A | A | A | A | A |
|  | Back sheet processability | — | A | B | A | C | A | B | A | A |

TABLE 12

|  |  |  | Example 29 | Example 30 | Example 31 | Example 32 | Example 33 | Example 34 | Example 35 | Example 36 |
|---|---|---|---|---|---|---|---|---|---|---|
| Clogging of extruder wire mesh |  | — | B | A | B | B | B | B | B | B |
| Foreign substances in pellet of resin composition | Dissolution method | Number |  |  |  |  |  |  |  |  |
|  | Press method | Number |  |  |  |  |  |  |  |  |
| Content of fluorine element |  | Mass ppm | 154 | 146 | 146 | 150 | 158 | 507 | 257 | 195 |
| Physical properties (injection molding) | UL94 VB test | Rank | V-0 | V-0 | V-0 | V-0 | V-0 | V-0 | V-0 | V-0 |
|  |  | Number of drops | 0 | 0 | 0 | 0 | 0 | 0 | 0 | 0 |
|  | Charpy impact strength | kJ/m² | 24 |  |  |  |  |  |  |  |
|  | Weld surface appearance | — | B | A |  |  |  |  |  |  |
|  | Concentration of oxygen in raw material feeding port in film forming machine | % by volume |  |  |  |  |  |  |  |  |
| Film properties | Film thickness | μm | 500 | 500 | 500 | 500 | 500 | 500 | 500 | 500 |
|  | Thickness precision Average | μm | 503 | 498 | 505 | 405 | 501 | 506 | 502 | 503 |
|  | Max. | μm | 510 | 504 | 510 | 505 | 506 | 511 | 508 | 506 |
|  | Min. | μm | 500 | 493 | 500 | 488 | 495 | 499 | 498 | 498 |
|  | Standard deviation | — | 3.2 | 3.9 | 4.2 | 6.0 | 4.7 | 3.5 | 3.3 | 3.2 |
|  | Insoluble fraction | % | 0.4 | 0.4 | 0.3 | 0.3 | 0.3 | 0.4 | 0.4 | 0.4 |
|  | Foreign substances | Number |  |  |  |  |  |  |  |  |
|  | UL94 VTM (VB) test | Rank | V-0 | V-0 | V-0 | V-0 | V-0 | V-0 | V-0 | V-0 |
|  | Glass transition temperature | °C. |  |  |  |  |  |  |  |  |
|  | Heat shrinkage rate MD | % |  |  |  |  |  |  |  |  |
|  | TD | % |  |  |  |  |  |  |  |  |
|  | Surface appearance (die drop, die line) | — | A | A | A | A | A | A | A | A |
|  | Surface appearance (gloss) | — |  |  |  |  |  |  |  |  |
|  | Back sheet processability | — |  |  |  |  |  |  |  |  |
|  | UL94 VTM test at film thickness of 60 μm | Rank | VTM-0 | VTM-0 | VTM-0 | VTM-0 | VTM-0 | VTM-0 | VTM-0 | VTM-0 |

TABLE 13

|  |  | Comparative Example 5 | Comparative Example 6 | Comparative Example 7 | Comparative Example 8 | Comparative Example 9 | Comparative Example 10 | Comparative Example 11 |
|---|---|---|---|---|---|---|---|---|
| Clogging of extruder wire mesh | — | A | B | B | C | A | B | B |
| Foreign substances in pellet of resin composition  Dissolution method | Number |  |  |  |  |  |  |  |
| Press method | Number |  |  |  |  |  |  |  |
| Content of fluorine element | Mass ppm | 221 | 218 | 211 | 3301 | 0 | 85 | 187 |
| Physical properties (injection molding)  UL94 VB test | Rank | V-0 | V-0 | V-1 | V-0 | V-0 | V-0 | V-0 |
|  | Number of drops | 0 | 0 | 0 | 0 | 0 | 0 | 0 |
| Charpy impact strength | kJ/m² |  |  |  |  |  |  |  |
| Weld surface appearance | — |  |  |  |  |  |  |  |
| Concentration of oxygen in raw material feeding port in film forming machine | % by volume |  |  |  |  |  |  |  |
| Film properties  Film thickness | μm | 50 | 50 | 50 |  | 500 | 500 | 500 |
| Thickness precision  Average | μm |  |  |  |  | 503 | 508 | 501 |
| Max. | μm |  |  |  |  | 525 | 513 | 525 |
| Min. | μm |  |  |  |  | 485 | 490 | 488 |
| Standard deviation | — |  |  |  |  | 12.4 | 11.2 | 12.9 |
| Insoluble fraction | % | 0.4 | 0.4 | 0.4 | 0.4 | 0.4 | 0.3 | 0.3 |
| Foreign substances | Number |  |  |  |  |  |  |  |
| UL94 VTM (VB) test | Rank | VTM-1 | VTM-0 | VTM-1 |  | V-0 | V-0 | V-0 |
| Glass transition temperature | °C. |  |  |  |  |  |  |  |
| Heat shrinkage rate  MD | % | 0.2 | Un-measurable | 0.1 |  |  |  |  |
| TD | % |  |  |  |  |  |  |  |
| Surface appearance (die drop, die line) | — |  |  |  | C | C | C | C |
| Surface appearance (gloss) | — |  |  |  |  |  |  |  |
| Back sheet processability | — |  |  |  |  |  |  |  |
| UL94 VTM test at film thickness of 60 μm | Rank |  |  |  |  | VTM-1 | VTM-1 | VTM-1 |

TABLE 14

|  |  | Example 37 | Example 38 | Example 39 | Example 40 | Example 41 | Example 42 | Example 43 |
|---|---|---|---|---|---|---|---|---|
| Clogging of extruder wire mesh | — | B | A | A | A | A | No wire mesh | A |
| Foreign substances in pellet of resin composition  Dissolution method | Number | Unmeasurable | 17 | 13 | 23 | 7 | 1 | Unmeasurable |
| Press method | Number | 5 | 16 | 14 | 21 | 6 | 0 | 7 |
| Content of fluorine element | Mass ppm | 215 | 232 | 228 | 225 | 228 | 220 | 220 |
| Physical properties (injection molding)  UL94 VB test | Rank | V-0 | V-0 | V-0 | V-0 | V-0 | V-0 | V-0 |
|  | Number of drops | 0 | 0 | 0 | 0 | 0 | 0 | 0 |
| Charpy impact strength | kJ/m² | 21 | 22 | 23 | 22 | 22 | 22 | 18 |
| Weld surface appearance | — | B | A | A | A | A | A | A |
| Concentration of oxygen in raw material feeding port in film forming machine | % by volume | 0.7 | 0.6 | 0.6 | 0.7 | 1.8 | 0.5 | 0.5 |
| Film properties  Film thickness | μm | 150 | 150 | 150 | 150 | 150 | 150 | 150 |
| Thickness precision  Average | μm | 150 | 151 | 151 | 151 | 150 | 150 | 152 |
| Max. | μm | 158 | 157 | 159 | 161 | 163 | 155 | 162 |
| Min. | μm | 143 | 146 | 146 | 142 | 142 | 147 | 141 |
| Standard deviation | — | 4.2 | 3.4 | 3.8 | 8.6 | 6.7 | 2.5 | 7.4 |
| Insoluble fraction | % | 0.6 | 0.4 | 0.4 | 0.4 | 0.4 | 0.5 | 8.1 |
| Foreign substances | Number | Unmeasurable | 28 | 20 | 29 | 26 | 4 | Unmeasurable |
| UL94 VTM (VB) test | Rank | VTM-0 | VTM-0 | VTM-0 | VTM-0 | VTM-0 | VTM-0 | VTM-2 |
| Glass transition temperature | °C. | 166 | 165 | 166 | 165 | 165 | 164 | 91 |
| Heat shrinkage rate  MD | % | 0.8 | 0.4 | 0.5 | 0.5 | 0.3 | 0.4 | Unmeasurable |
| TD | % | 0.4 | 0.3 | 0.3 | 0.3 | 0.3 | 0.2 |  |
| Surface appearance (die drop, die line) | — | A | A | A | B | B | A | B |
| Surface appearance (gloss) | — | A | A | A | B | B | A | C |
| Back sheet processability | — | A | A | A | B | B | A | C |
| UL94 VTM test at film thickness of 60 μm | Rank |  |  |  |  |  |  |  |

TABLE 14-continued

|  |  |  | Example 44 | Example 45 | Example 46 | Example 47 | Example 48 | Example 49 |
|---|---|---|---|---|---|---|---|---|
| Clogging of extruder wire mesh |  | — | No wire mesh | A | C | C | C | C |
| Foreign substances in pellet of resin composition | Dissolution method | Number | Unmeasurable |  |  |  |  |  |
|  | Press method | Number | 16 |  |  |  |  |  |
| Content of fluorine element |  | Mass ppm | 224 | 502 | 164 | 167 | 163 | 162 |
| Physical properties (injection molding) | UL94 VB test | Rank | V-0 | V-0 | V-0 | V-0 | V-0 | V-0 |
|  |  | Number of drops | 0 | 0 | 0 | 0 | 0 | 0 |
|  | Charpy impact strength | kJ/m$^2$ | 17 | 23 | 22 | 24 | 25 | 25 |
|  | Weld surface appearance | — | A | A | B | B | C | B |
| Concentration of oxygen in raw material feeding port in film forming machine |  | % by volume | 0.5 |  |  |  |  |  |
| Film properties | Film thickness | μm | 150 | 500 | 500 | 500 | 500 | 500 |
|  | Thickness precision Average | μm | 150 | 501 | 500 | 504 | 502 | 504 |
|  | Max. | μm | 161 | 505 | 505 | 510 | 505 | 522 |
|  | Min. | μm | 140 | 495 | 495 | 498 | 498 | 495 |
|  | Standard deviation | — | 7.3 | 3.8 | 4.0 | 4.1 | 3.2 | 11.6 |
|  | Insoluble fraction | % | 8.0 | 0.4 | 0.4 | 0.4 | 0.4 | 0.3 |
|  | Foreign substances | Number | Unmeasurable |  |  |  |  |  |
|  | UL94 VTM (VB) test | Rank | VTM-2 | V-0 | V-0 | V-0 | V-0 | V-0 |
|  | Glass transition temperature | ° C. | 90 |  |  |  |  |  |
|  | Heat shrinkage rate MD | % | Unmeasurable |  |  |  |  |  |
|  | TD | % |  |  |  |  |  |  |
|  | Surface appearance (die drop, die line) | — | B | A | A | B | B | B |
|  | Surface appearance (gloss) | — | C |  |  |  |  |  |
|  | Back sheet processability | — | C |  |  |  |  |  |
|  | UL94 VTM test at film thickness of 60 μm | Rank |  | VTM-0 | VTM-0 | VTM-0 | VTM-0 | VTM-0 |

TABLE 15

|  |  |  | Example 50 | Comparative Example 12 | Comparative Example 13 | Example 51 | Example 52 | Example 53 | Example 54 | Example 55 | Example 56 | Example 57 |
|---|---|---|---|---|---|---|---|---|---|---|---|---|
| Clogging of extruder wire mesh |  | — | A | A | A | A | A | A | A | A | A | A |
| Foreign substances in pellet of resin composition | Dissolution method | Number | Unmeasurable | Unmeasurable | Unmeasurable |  |  |  |  |  |  |  |
|  | Press method | Number | 7 | 5 | 5 |  |  |  |  |  |  |  |
| Content of fluorine element |  | Mass ppm | 220 | 219 | 81 | 235 | 236 | 233 | 111 | 977 | 227 | 248 |
| Physical properties (injection molding) | UL94 VB test | Rank | V-0 | V-2 | V-2 | V-1 | V-1 | V-1 | V-1 | V-1 | V-1 | V-1 |
|  |  | Number of drops | 0 | 1 | 1 | 0 | 0 | 0 | 0 | 0 | 0 | 0 |
|  | Charpy impact strength | kJ/m$^2$ | 18 | 13 | 19 | 24 | 25 | 22 | 27 | 25 | 34 | 23 |
|  | Weld surface appearance | — | A | A | A | A | A | A | A | A | A | A |
| Concentration of oxygen in raw material feeding port in film forming machine |  | % by volume | 0.5 | 0.6 | 0.6 |  |  |  |  |  |  |  |
| Film properties | Film thickness | μm | 150 | 150 | 150 | 150 | 150 | 150 | 150 | 150 | 150 | 150 |
|  | Thickness precision Average | μm | 152 | 151 | 150 |  |  |  |  |  |  |  |
|  | Max. | μm | 162 | 163 | 168 |  |  |  |  |  |  |  |
|  | Min. | μm | 141 | 139 | 134 |  |  |  |  |  |  |  |
|  | Standard deviation | — | 7.4 | 7.8 | 11.9 |  |  |  |  |  |  |  |
|  | Insoluble fraction | % | 8.1 | 6.7 | 6.7 |  |  |  |  |  |  |  |
|  | Foreign substances | Number | Unmeasurable | Unmeasurable | Unmeasurable |  |  |  |  |  |  |  |
|  | UL94 VTM (VB) test | Rank | VTM-2 | VTM-1 | VTM-1 |  |  |  |  |  |  |  |
|  | Glass transition temperature | ° C. | 91 | 81 | 90 |  |  |  |  |  |  |  |
|  | Heat shrinkage rate MD | % | Unmeasurable | Unmeasurable | Unmeasurable |  |  |  |  |  |  |  |
|  | TD | % |  |  |  |  |  |  |  |  |  |  |
|  | Surface appearance (die drop, die line) | — | B | B | B |  |  |  |  |  |  |  |

TABLE 15-continued

|  |  | Example 50 | Comparative Example 12 | Comparative Example 13 | Example 51 | Example 52 | Example 53 | Example 54 | Example 55 | Example 56 | Example 57 |
|---|---|---|---|---|---|---|---|---|---|---|---|
| Surface appearance (gloss) | | — | C | C | C | | | | | | |
| Back sheet processability | | — | C | C | C | | | | | | |

TABLE 16

|  |  |  | Example 58 | Example 59 | Example 60 | Example 61 | Example 62 | Example 63 | Comparative Example 14 | Comparative Example 15 | Comparative Example 16 |
|---|---|---|---|---|---|---|---|---|---|---|---|
| Clogging of extruder wire mesh | | — | A | A | A | A | B | B | C | A | B |
| Foreign substances in pellet of resin composition | Dissolution method | Number | | | | | | | | | |
| | Press method | Number | | | | | | | | | |
| Content of fluorine element | | Mass ppm | 248 | 244 | 251 | 239 | 252 | 298 | 433 | 88 | 1103 |
| Physical properties (injection molding) | UL94 VB test | Rank | V-1 | V-1 | V-1 | V-1 | V-1 | V-1 | V-1 | Eq. to HB | Eq. to HB |
| | Number of drops | | 0 | 0 | 0 | 0 | 1 | 0 | 0 | 2 | 4 |
| | Charpy impact strength | kJ/m$^2$ | 28 | 26 | 26 | 20 | 19 | 24 | 24 | 24 | 19 |
| | Weld surface appearance | — | A | A | A | A | B | B | B | A | A |
| Concentration of oxygen in raw material feeding port in film forming machine | | % by volume | | | | | | | | | |
| Film properties | Film thickness | μm | 150 | 150 | 150 | 150 | 150 | 150 | 150 | 150 | 150 |
| | Thickness precision | Average μm | | | | | | | | | |
| | | Max. μm | | | | | | | | | |
| | | Min. μm | | | | | | | | | |
| | | Standard deviation | — | | | | | | | | |
| | Insoluble fraction | % | | | | | | | | | |
| | Foreign substances | Number | | | | | | | | | |
| | UL94 VTM (VB) test | Rank | | | | | | | | | |
| | Glass transition temperature | °C. | | | | | | | | | |
| | Heat shrinkage rate | MD % | | | | | | | | | |
| | | TD % | | | | | | | | | |
| | Surface appearance (die drop, die line) | — | | | | | | | | | |
| | Surface appearance (gloss) | — | | | | | | | | | |
| | Back sheet processability | — | | | | | | | | | |

From Tables 9 to 16, it turned out that the flame-retardant polyphenylene ether resins obtained according to the present embodiment have high flame retardancy and a good surface appearance, and reduce clogging of the wire mesh in the extrusion process.

The films having the corresponding thickness in Examples 1 to 63 had a good film appearance and flame retardancy of VTM-0 or VTM-1, and sufficiently high heat resistance, leading to high processability of the back sheet.

Example 14 and Example 37 are examples of the resin composition into which the same composition using PTFE as the component (c) was formed by a different method; and the resin film formed of the resin composition. The film properties in both examples showed a difference in thickness precision, leading to differences in the surface appearance and back sheet processability.

The resin compositions obtained in Example 43 and Example 44 were not suitable for the material for the back sheet while these had flame retardancy of V-0 and a good weld appearance.

This application is based on Japanese Patent Application No. 2011-113501, filed on May 20, 2011, Japanese Patent Application No. 2011-113503, filed on May 20, 2011, and Japanese Patent Application No. 2012-036569, filed on Feb. 22, 2012, the contents of which are incorporated herein by reference.

INDUSTRIAL APPLICABILITY

The resin composition or flame-retardant resin film according to the present invention has high flame retardancy, high thickness precision, and reduced foreign substances. If the flame-retardant resin film is fed to the solar battery back sheet, a solar battery back sheet having high back sheet processability and flame retardancy can be obtained.

The invention claimed is:
1. A flame-retardant resin film obtained from a resin composition,
wherein the resin composition comprises (a) a polyphenylene ether resin or a mixture consisting of 30 to

99.9% by mass of a polyphenylene ether resin and 0.1 to 70% by mass of a polystyrene resin, (b) a phosphorus flame retardant, and (c) an ethylene-tetrafluoroethylene (FTFE) copolymer resin, the polyphenylene ether resin contains a bonding unit represented by the following formula (1):

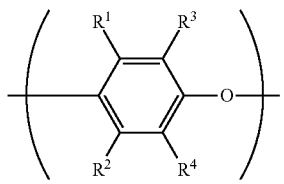

(1)

wherein $R^1, R^2, R^3$, and $R^4$ may be the same or different from each other and each is selected from the group consisting of hydrogen, halogen, a primary or secondary lower alkyl group having 1 to 7 carbon atoms, a phenyl group, a haloalkyl group, an aminoalkyl group, a hydrocarbon oxy group, and a halohydrocarbon oxy group in which a halogen atom and an oxygen atom are separated by at least two carbon atoms, in the resin composition, component (a) is 75 to 98 parts by mass and component (b) is 2 to 25 parts by mass, based on 100 parts by mass of components (a) and (b) in total, fluorine content in the resin composition is 100 to 1000 mass ppm, and the flame-retardant resin film has a thickness of 20 to 500 μm.

2. The flame-retardant resin film according to claim 1, wherein the resin composition further comprises an elastomer (d), and in the resin composition, component (d) is 1 to 25 parts by mass based on 100 parts by mass of components (a) and (b) in total.

3. A solar battery back sheet, comprising the flame-retardant resin film according to claim 1.

4. A flame-retardant resin composition, comprising a polyphenylene ether resin (a), a phosphate ester flame retardant (b), and an ethylene-tetrafluoroethylene copolymer (c), the polyphenylene ether resin contains a bonding unit represented by the following formula (1):

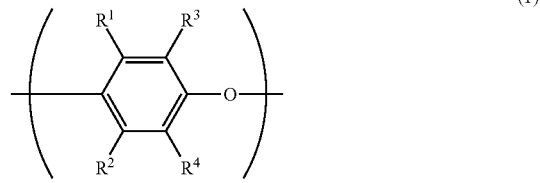

wherein $R^1$, $R^2$, $R^3$, and $R^4$ may be the same or different from each other and each is selected from the group consisting of hydrogen, halogen, a primary or secondary lower alkyl group having 1 to 7 carbon atoms, a phenyl group, a haloalkyl group, an aminoalkyl group, a hydrocarbon oxy group, and a halohydrocarbon oxy group in which a halogen atom and an oxygen atom are separated by at least two carbon atoms, wherein a content of the component (a) is 75 to 98 parts by mass and a content of the component (b) is 2 to 25 parts by mass, based on 100 parts by mass of the components (a) and (b) in total, and fluorine content is 100 to 1000 mass ppm.

5. The flame-retardant resin composition according to claim 4, further comprising an elastomer (d), wherein component (d) is 1 to 25 parts by mass based on 100 parts by mass of components (a) and (b) in total.

6. A resin pellet, comprising the flame-retardant resin composition according to claim 4.

7. An injection molded article, comprising the flame-retardant resin composition according to claim 4.

8. A solar battery back sheet, comprising the flame-retardant resin film according to claim 2.

9. A resin pellet, comprising the flame-retardant resin composition according to claim 5.

10. An injection molded article, comprising the flame-retardant resin composition according to claim 5.

* * * * *